US012684882B2

(12) United States Patent
Choi et al.

(10) Patent No.: US 12,684,882 B2
(45) Date of Patent: Jul. 14, 2026

(54) IMAGE SENSOR PACKAGE AND METHOD OF FABRICATING THE SAME

(71) Applicant: SAMSUNG ELECTRONICS CO., LTD., Suwon-si (KR)

(72) Inventors: Youngjae Choi, Suwon-si (KR); Sungho Suh, Suwon-si (KR); Minsun Keel, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 529 days.

(21) Appl. No.: 18/137,684

(22) Filed: Apr. 21, 2023

(65) Prior Publication Data

US 2024/0072084 A1     Feb. 29, 2024

(30) Foreign Application Priority Data

Aug. 30, 2022     (KR) ......................... 10-2022-0109491

(51) Int. Cl.
H10F 39/00         (2025.01)

(52) U.S. Cl.
CPC ......... H10F 39/804 (2025.01); H10F 39/026 (2025.01); H10F 39/802 (2025.01); H10F 39/811 (2025.01)

(58) Field of Classification Search
CPC .... H10F 39/026; H10F 39/802; H10F 39/804; H10F 39/811
See application file for complete search history.

(56) References Cited

U.S. PATENT DOCUMENTS

| | | | |
|---|---|---|---|
| 8,390,087 | B2 | 3/2013 | Tu et al. |
| 8,569,749 | B2 | 10/2013 | Kim |
| 8,928,104 | B2 | 1/2015 | Tu et al. |
| 9,887,381 | B2 | 2/2018 | Shin |
| 10,312,276 | B2 | 6/2019 | Chien et al. |
| 10,367,166 | B2 | 7/2019 | Cho |

(Continued)

FOREIGN PATENT DOCUMENTS

| | | | |
|---|---|---|---|
| JP | 3513168 | B2 | 3/2004 |
| KR | 10-2010-0027857 | A | 3/2010 |

(Continued)

OTHER PUBLICATIONS

Communication issued Feb. 26, 2025 by the Taiwan Intellectual Property Office in Taiwanese Patent Application No. 112119421.

(Continued)

*Primary Examiner* — Matthew E Warren
(74) *Attorney, Agent, or Firm* — Sughrue Mion, PLLC

(57) ABSTRACT
Provided are an image sensor package with improved reliability and a method of fabricating the same. The image sensor package includes: a package substrate; an image sensor chip provided on the package substrate, and including a pixel area and a peripheral area surrounding the pixel area; a dam in the peripheral area, the dam having a rectangular ring shape and surrounding the pixel area; a transparent cover provided on the dam and covering an upper portion of the image sensor chip; and a sealing material sealing the image sensor chip and covering side surfaces of the transparent cover. The dam includes a stress relaxation layer (SRL) and a body layer on the SRL, and the SRL has a lower viscosity than a viscosity of the body layer.

19 Claims, 29 Drawing Sheets

(56) References Cited

U.S. PATENT DOCUMENTS

| | | | |
|---|---|---|---|
| 10,937,844 B2 | 3/2021 | Kim et al. | |
| 2009/0267170 A1 * | 10/2009 | Chien | H10F 39/011 |
| | | | 257/434 |
| 2012/0313203 A1 * | 12/2012 | Fuse | H01L 24/97 |
| | | | 257/E31.127 |
| 2020/0111829 A1 * | 4/2020 | Fan | H10F 39/011 |
| 2020/0373341 A1 | 11/2020 | Jo et al. | |
| 2021/0028217 A1 * | 1/2021 | Cho | H01L 21/6836 |
| 2021/0193717 A1 | 6/2021 | Cho | |
| 2022/0115426 A1 | 4/2022 | Son | |
| 2022/0139984 A1 * | 5/2022 | Cho | H10F 39/811 |
| | | | 257/434 |
| 2025/0160012 A1 * | 5/2025 | Hamaguchi | H10F 39/811 |

FOREIGN PATENT DOCUMENTS

| | | | | |
|---|---|---|---|---|
| KR | 10-2019-0038073 A | 4/2019 | | |
| KR | 10-2021-0012302 A | 2/2021 | | |
| KR | 10-2021-0080718 A | 7/2021 | | |
| KR | 10-2022-0028368 A | 3/2022 | | |
| KR | 10-2022-0047030 A | 4/2022 | | |
| TW | 200849507 A | 12/2008 | | |
| TW | 201104850 A | 2/2011 | | |
| TW | 201123368 A | 7/2011 | | |
| TW | 201519334 A * | 5/2015 | | |
| TW | 201911491 A | 3/2019 | | |
| TW | 201911555 A | 3/2019 | | |
| WO | WO-2022113774 A1 * | 6/2022 | ........ | H10F 39/8057 |

OTHER PUBLICATIONS

Communication dated Jan. 29, 2026, issued by the Korean Ministry of Intellectual Property in Korean Application No. 10-2022-0109491.

* cited by examiner

IMAGE SENSOR PACKAGE AND METHOD OF FABRICATING THE SAME

CROSS-REFERENCE TO RELATED APPLICATION

This application is based on and claims priority to Korean Patent Application No. 10-2022-0109491, filed on Aug. 30, 2022, in the Korean Intellectual Property Office, the disclosure of which is incorporated by reference herein in its entirety.

BACKGROUND

The present disclosure relates to an image sensor, and more particularly, to an image sensor package and a method of fabricating the same.

An image sensor package is a core component of a camera device, and may be used in various fields including general cameras, portable terminals such as mobile phones and tablets, and vehicles. Such an image sensor package may have various package structures, such as a chip on board (COB) package, a chip on flexible printed circuit board (PCB) (COF) package, a chip on glass (COG) package, a wafer level chip scale package (WLCSP), an image sensor ball grid array (IBGA) package, a plastic leadless chip carrier (PLCC) package, or the like. An image sensor package having an IBGA structure, which is widely applied to vehicles, may be formed by mounting an image sensor on a package substrate and bonding a transparent layer to an upper portion of the image sensor.

SUMMARY

Example embodiments provide an image sensor package with improved reliability and a method of fabricating the same.

Example embodiments are not limited thereto, and other objects may be clearly understood by those skilled in the art from the followings.

According to an aspect of an example embodiment, an image sensor package includes: a package substrate; an image sensor chip provided on the package substrate, and including a pixel area and a peripheral area surrounding the pixel area; a dam in the peripheral area, the dam having a rectangular ring shape and surrounding the pixel area; a transparent cover provided on the dam and covering an upper portion of the image sensor chip; and a sealing material sealing the image sensor chip and covering side surfaces of the transparent cover. The dam includes a stress relaxation layer (SRL) and a body layer on the SRL, and the SRL has a lower viscosity than a viscosity of the body layer.

According to another aspect of an example embodiment, an image sensor package includes: pixel area and covering a chip pad of the image sensor chip; a transparent cover on the dam and spaced apart from an upper surface of the image sensor chip; a bonding wire electrically connecting the chip pad and the substrate pad; and a sealing material on the package substrate, the image sensor chip, and side surfaces of the transparent cover. The dam includes an SRL and a body layer on the SRL, and the SRL has a lower viscosity than a viscosity of the body layer.

According to another aspect of an example embodiment, a method of fabricating an image sensor package, includes: providing a package substrate; mounting an image sensor chip on the package substrate, the image sensor chip including a pixel area and a peripheral area surrounding the pixel area; connecting a chip pad of the image sensor chip and a substrate pad of the package substrate with a bonding wire; forming a dam in the peripheral area, the dam having a rectangular ring shape and surrounding the pixel area; attaching a transparent cover to the dam to be spaced apart from an upper surface of the image sensor chip and to cover the image sensor chip; forming a sealing material on the package substrate, the sealing material sealing the image sensor chip and covering side surfaces of the transparent cover; and forming an external connection terminal on a lower surface of the package substrate. The dam includes an SRL and a body layer on the SRL, and the SRL has a lower viscosity than a viscosity of the body layer.

BRIEF DESCRIPTION OF DRAWINGS

The above and other aspects and features of the present disclosure will be more clearly understood from the following description of example embodiments, taken in conjunction with the accompanying drawings, in which.

DETAILED DESCRIPTION

Figure 1A:
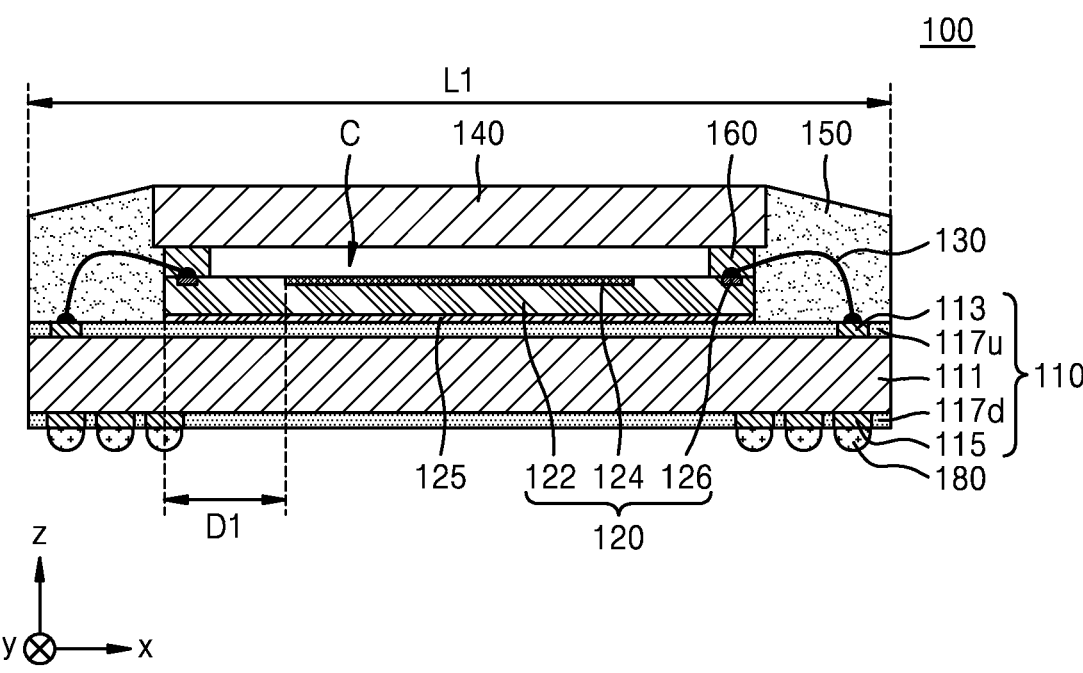
FIGS. 1A and 1B are a cross-sectional view and a plan view, respectively, of an image sensor package according to an example embodiment.

Example embodiments will be described with reference to the accompanying drawings. Like components are denoted by like reference numerals throughout the specification, and repeated descriptions thereof are omitted. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

Figure 1B:
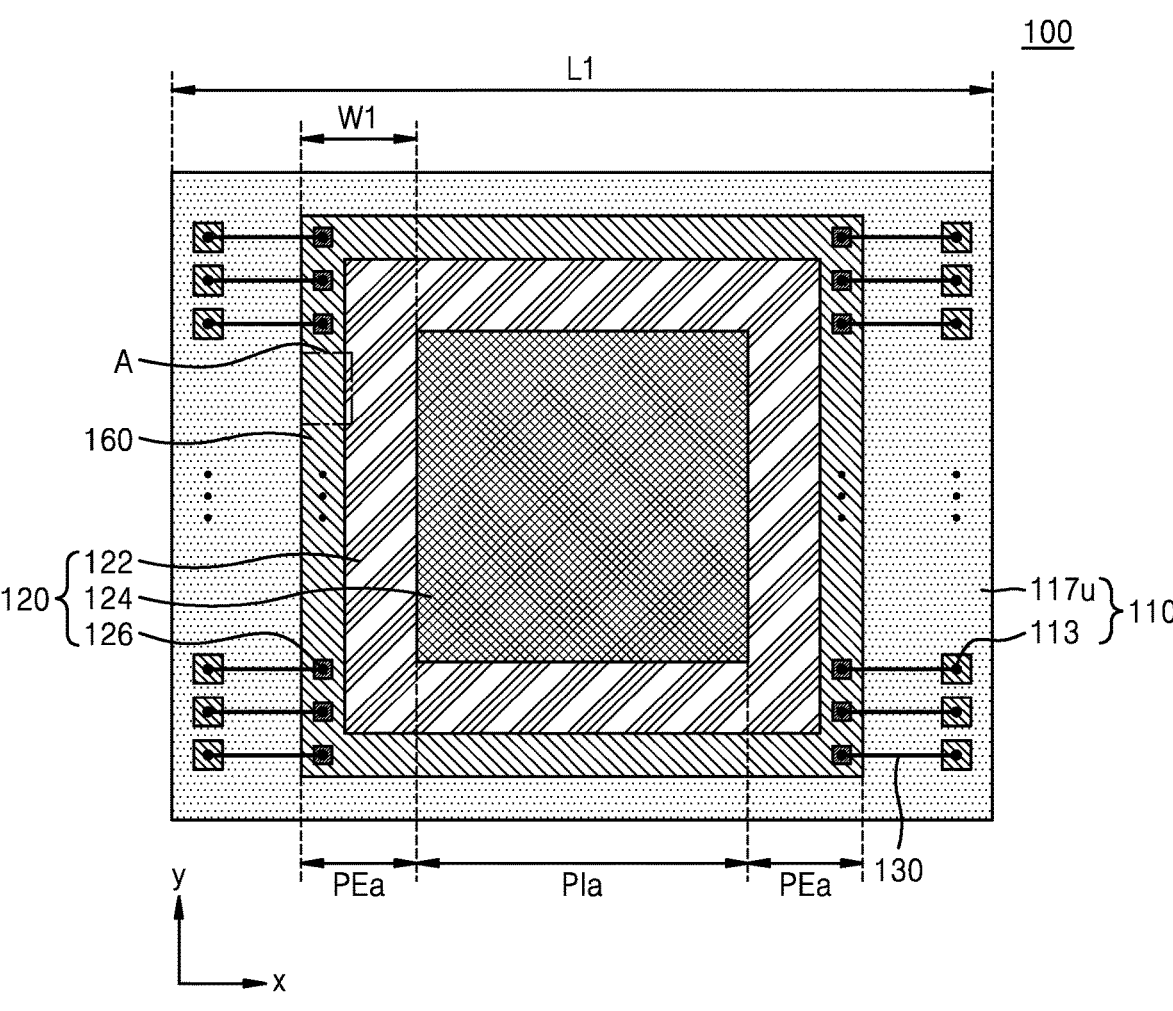

FIGS. 1A and 1B are a cross-sectional view and a plan view, respectively, of an image sensor package according to an example embodiment, and a transparent cover and a sealing material are omitted in the plan view.

Referring to FIGS. 1A and 1B, an image sensor package 100 according to an example embodiment may include a package substrate 110, an image sensor chip 120, a bonding wire 130, a transparent cover 140, a sealing material 150, and a dam 160.

The package substrate 110 may have a rectangular shape in a plan view. In the image sensor package 100, the package substrate 110 may have, for example, a rectangular shape having a length longer in a first direction (x direction) than that in a second direction (y direction). However, according to an example embodiment, the package substrate 110 may have a square shape. The package substrate 110 may have a first length L1 in a long direction, that is, the first direction (x direction). The first length L1 may be, for example, 8.0 mm or less. However, the first length L1 is not limited thereto. In addition, a side surface of the sealing material 150 on the package substrate 110 may be limited by a side surface of the package substrate 110. Accordingly, the planar size of the image sensor package 100 may be generally determined by the size of the package substrate 110.

The package substrate 110 may include a substrate body 111, an upper substrate pad 113, a lower substrate pad 115, and protective layers 117u and 117d. The substrate body 111 may occupy most of the package substrate 110 and form an external shape of the package substrate 110. The package substrate 110 may include various materials. For example, according to the type of the package substrate 110, the substrate body 111 may include silicon, ceramic, an organic material, glass, an epoxy resin, or the like. In the image sensor package 100, the package substrate 110 may be a printed circuit board (PCB) based on an epoxy resin. However, the package substrate 110 is not limited to a PCB. Single-layered or multi-layered wires may be formed on the substrate body 111. Wires may be on upper and lower surfaces of the substrate body 111 and/or inside the substrate body 111. The upper substrate pad 113 and the lower substrate pad 115 may be electrically connected to each other through the wires.

The upper substrate pad 113 may be on an upper surface of the package substrate 110, that is, an upper surface of the substrate body 111, and may be connected to the wires of the substrate body 111. The upper substrate pad 113 may be arranged along both side surfaces of the image sensor chip 120 mounted on the package substrate 110. In addition, the upper substrate pad 113 may be electrically connected to a chip pad 126 corresponding to the image sensor chip 120 through the bonding wire 130.

The upper substrate pad 113 may be arranged on both outer portions of the package substrate 110 in the first direction (x direction). Also, the upper substrate pad 113 may be arranged in the second direction (y direction). As shown in FIG. 1B, the upper substrate pad 113 may be arranged in one row in the second direction (y direction). However, according to an example embodiment, the upper substrate pad 113 may be arranged in at least two rows in the second direction (y direction).

The lower substrate pad 115 may be on a lower surface of the package substrate 110, that is, a lower surface of the substrate body 111, and may be connected to the wires of the substrate body 111. The lower substrate pad 115 may be arranged on both outer portions of the package substrate 110 in the first direction (x direction). In addition, the lower substrate pad 115 may be arranged in three rows in the second direction (y direction). However, the arrangement structure of the lower substrate pad 115 is not limited thereto. For example, the lower substrate pad 115 may be arranged in two rows or at least four rows. In addition, the lower substrate pad 115 may also be arranged in a two-dimensional array structure over the entire lower surface of the package substrate 110.

The protective layers 117u and 117d may protect the substrate body 111 and the wires thereof by covering the upper and lower surfaces of the substrate body 111. The protective layers 117u and 117d may include an upper protective layer 117u on the upper surface of the substrate body 111, and a lower protective layer 117d on the lower surface of the substrate body 111. The protective layers 117u and 117d may include, for example, solder resist (SR). However, the materials of the protective layers 117u and 117d are not limited to SR. The upper substrate pad 113 may extend through and be exposed from the upper protective layer 117u, and the lower substrate pad 115 may extend through and be exposed from the lower protective layer 117d.

An external connection terminal 180 may be on the lower substrate pad 115. The external connection terminal 180 may include for example, a solder ball. Accordingly, the image sensor package 100 may correspond to an IBGA package. The image sensor package 100 may be mounted on an external substrate 510 (refer to FIG. 7), such as a camera device, through the external connection terminal 180.

The image sensor chip 120 may be mounted on the package substrate 110 in a wire-bonding structure. Accordingly, an active surface of the image sensor chip 120 may face upward (i.e., away from the package substrate 110), and an inactive surface thereof may face downward (i.e., toward the package substrate 110). The image sensor chip 120 may be adhered to and fixed to the upper surface of the package substrate 110 through an adhesive layer 125. The adhesive layer 125 may adhere the image sensor chip 120 to the package substrate 110, and may also relieve the impact applied to the image sensor chip 120 when an external impact is applied.

The image sensor chip 120 may include a chip body 122, a sensor 124, and the chip pad 126. The chip body 122 may include a substrate and a wire layer of the image sensor chip 120. The substrate of the chip body 122 may include, for example, a bulk wafer, an epitaxial wafer, or the like. The epitaxial wafer may include a crystalline material layer, that is, an epitaxial layer, grown on a bulk substrate by an epitaxial process. The substrate of the chip body 122 is not limited to a bulk wafer or an epitaxial wafer, and may be formed by using various wafers, such as a polished wafer, an annealed wafer, a silicon on insulator (SOI) wafer, or the like. The wire layer of the chip body 122 may be formed on any one surface of the substrate. For example, the wire layer may be arranged below the sensor 124.

The sensor 124 may include a pixel area Pla having a plurality of pixels. The pixel area Pla may also be referred to as an active pixel sensor (APS) area. The plurality of pixels may be arranged in a two-dimensional array structure in the pixel area Pla. In addition, each of the plurality of pixels of the pixel area Pla may include a photodiode (PD)

formed in a substrate. The PD may be formed through an ion implantation process in which impurity ions are implanted into the pixel area Pla. Each of the plurality of pixels of the pixel area Pla may absorb incident light to generate and accumulate charges corresponding to an amount of the incident light, and may transmit the accumulated charges to the outside through a pixel transistor. The pixel transistor may include, for example, a transfer transistor, a source follower transistor, a reset transistor, a selection transistor, or the like. As shown in FIG. 1B, the sensor 124 may be arranged at a central portion of the image sensor chip 120. The image sensor chip 120 may include a color filter and a micro lens, which are arranged at an upper portion of the pixel area Pla.

The chip pad 126 may be arranged in a peripheral area PEa of the image sensor chip 120. The peripheral area PEa may refer to an outer portion of the image sensor chip 120, which surrounds the sensor 124. As shown in FIG. 1B, the chip pad 126 may be arranged at outer portions of the peripheral areas PEa on both sides of the image sensor chip 120 in the first direction (x direction). In addition, the chip pad 126 may be arranged in one row in the second direction (y direction). However, the arrangement structure of the chip pad 126 is not limited thereto. For example, the chip pad 126 may be arranged in at least two rows. The chip pad 126 may be electrically connected to the wire layer of the image sensor chip 120.

The chip pad 126 may be electrically connected to the upper substrate pad 113 corresponding to the package substrate 110 through the bonding wire 130. For example, a first end of the bonding wire 130 may be connected to the chip pad 126, and a second end of the bonding wire 130 may be connected to the upper substrate pad 113. The bonding wire 130 may include, for example, gold (Au), copper (Cu), silver (Ag), aluminum (Al), or the like. In the image sensor package 100, the bonding wire 130 may include, for example, Au.

The transparent cover 140 may be on the image sensor chip 120. The transparent cover 140 may be on the dam 160 formed on the upper surface of the image sensor chip 120. That is, the transparent cover 140 may be arranged to be spaced apart from the upper surface of the image sensor chip 120 by the height of the dam 160. Accordingly, a cavity C, which is an empty space, may be between the transparent cover 140 and the image sensor chip 120. The transparent cover 140 may include, for example, transparent glass, transparent resin, or transmissive ceramic.

The dam 160 may be on an outer portion of the upper surface of the image sensor chip 120. As shown in FIG. 1B, the dam 160 may have, for example, a rectangular ring shape surrounding the outer portion of the upper surface of the image sensor chip 120. In addition, the dam 160 may cover the chip pad 126 of the image sensor chip 120. Accordingly, the dam 160 may cover the first end of the bonding wire 130 connected to the chip pad 126.

The dam 160 may support the transparent cover 140 on the image sensor chip 120. In addition, the dam 160 may seal the cavity C and block moisture or foreign materials from penetrating into the cavity C from the outside. That is, the dam 160 may prevent the image sensor chip 120, particularly the sensor 124, from being contaminated by external moisture or foreign materials.

As described above, the dam 160 may be formed on the upper surface of the image sensor chip 120 in a shape surrounding the sensor 124 (e.g., a rectangular ring shape), support the transparent cover 140 and prevent contamination of the sensor 124. As a size of the image sensor chip 120 is reduced due to the recent developments, a first distance D1, which is an interval between an edge of the sensor 124 and an edge of the image sensor chip 120, is reduced. For example, the first distance D1 is reduced from about 1000 µm to about 350 µm. The dam 160 may have a quadrilateral ring shape surrounding the outermost portion of the image sensor chip 120, more particularly, a rectangular ring shape, as shown in FIG. 1B. In addition, the dam 160 may cover the chip pad 126 arranged at the outermost portion of the image sensor chip 120, and the first end of the bonding wire 130 connected to the chip pad 126.

As the dam 160 is arranged at the outermost portion of the image sensor chip 120, as shown in FIG. 1A, the outer side surface of the dam 160 may be almost adjacent to the side surface of the image sensor chip 120, or may be substantially the same as the side surface of the image sensor chip 120. For example, the outer side surface of the dam 160 may be aligned with the side surface of the image sensor chip 120, along the first direction (x direction). In addition, the size of the transparent cover 140 may be greater than the size of the image sensor chip 120. For example, the length of the transparent cover 140 in the first direction (x direction) may be greater than the length of the image sensor chip 120 in the first direction (x direction). Accordingly, the outer side surface of the dam 160 may be positioned more inward then the side surface of the transparent cover 140. In this regard, the outer side surface of the dam 160 may be offset from the side surface of the transparent cover 140, along the first direction (x direction). However, structures of the side surfaces of the dam 160, the image sensor chip 120, and the transparent cover 140 are not limited thereto. For example, according to an example embodiment, the transparent cover 140 may be smaller than the image sensor chip 120. In the case of such a structure, the outer side surface of the dam 160 may be almost adjacent to the side surface of the transparent cover 140, or may be substantially the same as the side surface of the transparent cover 140. For example, the outer side surface of the dam 160 may be aligned with the side surface of the transparent cover 140, along the first direction (x direction). Also, the outer side surface of the dam 160 may be positioned more inward than the side surface of the image sensor chip 120.

Figure 2A:
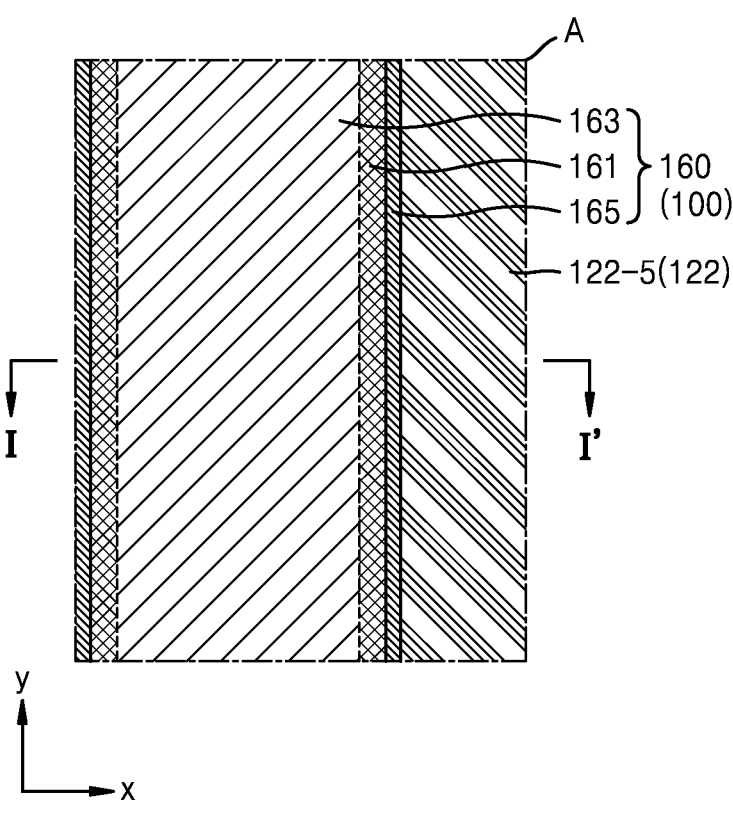
FIGS. 2A and 2B are a plan view and a cross-sectional view, respectively, illustrating an enlarged dam portion in the image sensor package of FIG. 1A.
Figure 2B:
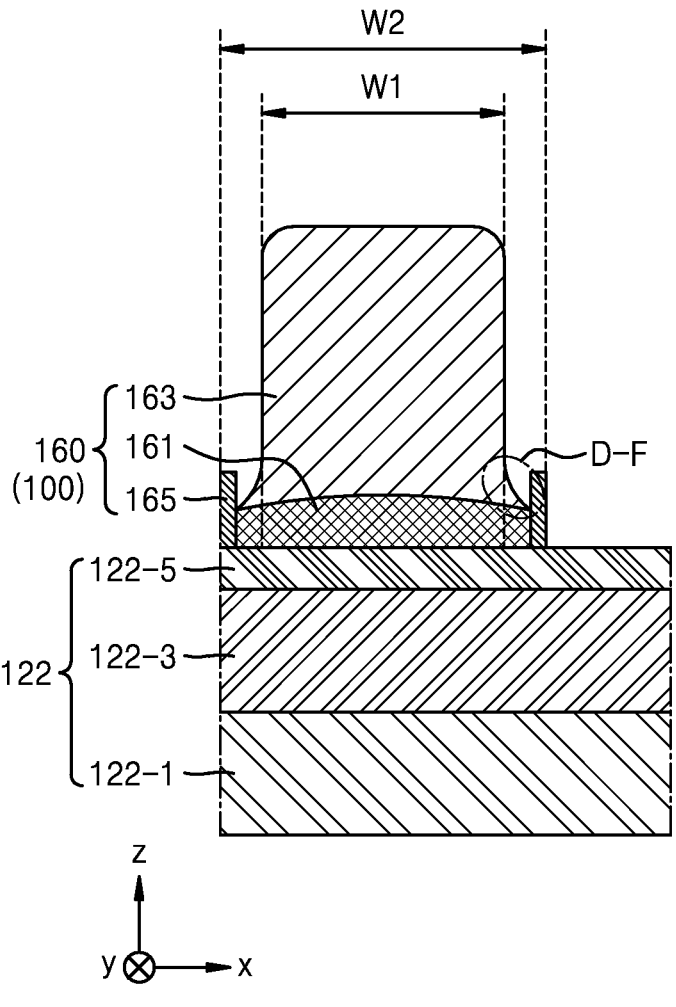

The dam 160 may include a stress relaxation layer (SRL) 161 (refer to FIG. 2B) and a body layer 163 (refer to FIG. 2B). The SRL 161 may be on the chip body 122 of the image sensor chip 120, and the body layer 163 may be on the SRL 161. The SRL 161 may include a material capable of reducing a difference in coefficient of thermal expansion (CTE) between the body layer 163 and a lower layer of the dam 160. According to an example embodiment, the dam 160 may further include a dam-wall 165 (refer to FIG. 2B).

The body layer 163 may include an epoxy resin. However, the material of the body layer 163 is not limited to an epoxy resin. Because epoxy resin is cured by ultraviolet (UV) light and acts as an adhesive, it may be referred to as UV glue, UV epoxy glue, or the like. The SRL 161 may include a material having a lower viscosity than that of the body layer 163. For example, the SRL 161 may include a silicone-based material. However, the material of the SRL 161 is not limited to a silicone-based material. The particular structure and material of the dam 160 are described in more detail with reference to FIGS. 2A to 4B.

The sealing material 150 may be on the package substrate 110, and may seal the image sensor chip 120, the bonding wire 130, and the transparent cover 140. In particular, the sealing material 150 may be formed to cover the side surfaces of the image sensor chip 120 and the transparent cover 140 from the upper surface of the package substrate 110. In addition, the sealing material 150 may cover the bonding wire 130 and the side surfaces of the dam 160. The sealing material 150 and the dam 160 may prevent the sensor 124 from being contaminated by external foreign materials. In addition, the sealing material 150 may protect the image sensor package 100 from external impact.

The sealing material 150 may surround the entire side surface of the transparent cover 140, and the upper surface of the sealing material 150 may have a slight inclination with the upper surface of the transparent cover 140. However, according to an example embodiment, the upper surface of the sealing material 150 may be substantially coplanar with the upper surface of the transparent cover 140. The sealing material 150 may include, for example, an epoxy molding compound (EMC). However, the material of the sealing material 150 is not limited to an EMC.

The image sensor package 100 may have a structure in which the image sensor chip 120 is mounted on the package substrate 110 through a wire bonding structure, the dam 160 having a rectangular ring shape is arranged at the outer portions of the upper surface of the image sensor chip 120, and the transparent cover 140 is on the dam 160. Also, the dam 160 may include the SRL 161 at a lower portion thereof and the body layer 163 at an upper portion thereof, and the SRL 161 may include a material having a lower viscosity than that of the body layer 163. According to example embodiments, the image sensor package 100, due to the structure and physical properties of the dam 160, may relieve the stress of the lower layer of the dam 160, and accordingly, cracks in the lower layer and a delamination phenomenon between lower layers may be prevented. As a result, the image sensor package 100 may have greatly improved reliability.

For reference, when forming a dam including only an epoxy resin, a three-operation curing process may be performed. For example, the three-operation curing process may include a first operation of UV curing at 3 J/cm$^2$, a second operation of heat treatment at 80° C. for 30 minutes, and a third operation of heat treatment at 130° C. for 30 minutes. Also, in general, heat generation and contraction may occur in the first operation, heat generation may occur in the second operation, and expansion may occur in the third operation. Accordingly, in the three-operation curing process of forming a dam, a lower layer of the dam is severely stressed, and thus, cracks in the lower layer and a delamination phenomenon between lower layers may occur. As a result, the reliability of an image sensor package product may be greatly reduced. On the contrary, in the image sensor package 100, the dam 160 including the SRL 161 having a lower viscosity at a lower portion thereof may be arranged on the image sensor chip 120, and thus all problems described above may be solved.

FIGS. 2A and 2B are a plan view and a cross-sectional view, respectively, of the dam portion in the image sensor package of FIG. 1A, wherein FIG. 2A is a plan view of an enlarged region A of FIG. 1B, and FIG. 2B is a cross-sectional view taken along a line I-I' of FIG. 2A. In the plan view, a dam-foot D-F portion is omitted, and the SRL 161 is illustrated outside the body layer 163. Description will be given with reference to FIGS. 1A and 1B together, and description already given with reference to FIGS. 1A and 1B will be simply given or omitted.

Referring to FIGS. 2A and 2B, in the image sensor package 100, the dam 160 may include the SRL 161, the body layer 163, and the dam-wall 165. The SRL 161 may be on the chip body 122, and may extend in the first direction (x direction) or the second direction (y direction) corresponding to the shape of the dam 160. Hereinafter, based on FIG. 2A, the dam 160 is described as having a portion extending in the second direction (y direction).

The SRL 161 may have a thickness of, for example, several μm to several tens of μm in a third direction (z direction). However, the thickness of the SRL 161 is not limited thereto. The SRL 161 may have a slightly greater thickness at a central portion thereof than the thickness of both outer portions thereof in the first direction (x direction), as shown in FIG. 2B. However, the thickness structure of the SRL 161 is not limited thereto. For example, the SRL 161 may have a uniform thickness in the first direction (x direction).

Two dam-walls 165 may respectively be arranged on both sides of the body layer 163 in the first direction (x direction). The dam-wall 165 may extend in the second direction (y direction). Like the body layer 163, the dam-wall 165 may include an epoxy resin. The SRL 161 may be between the two dam-walls 165. As shown in FIG. 2B, each of the two dam-walls 165 may have a thickness of, for example, several μm to several tens of μm in the third direction (z direction), and may have a greater thickness than that of the SRL 161.

The body layer 163 may be on the SRL 161. In addition, the body layer 163 may be between the two dam-walls 165. The body layer 163 may have a first width W1 in the first direction (x direction). The width W1 may be, for example, 300 μm or less. However, the first width W1 of the body layer 163 is not limited thereto. The dam-foot D-F may be formed at a lower portion of the body layer 163. The dam-foot D-F may be formed while the lower portion of the body layer 163 slightly spreads outward in the first direction (x direction) during the formation of the body layer 163. The first width W1 of the body layer 163 may be defined as a width of an upper portion of the body layer 163 except the dam-foot D-F portion, and the upper portion may have a uniform width.

When the dam 160 has a second width W2 in the first direction (x direction), the width of the dam 160 may be determined by the dam-wall 165 rather than the body layer 163. For example, as shown in FIG. 2B, a distance between the outer surfaces of the two dam-walls 165 in the first direction (x direction) may correspond to the second width W2. When a width of each of the two dam-walls 165 in the first direction (x direction) is very small, for example, when the width of each of the two dam-walls 165 in the first direction (x direction) is several μm or less, the SRL 161 may substantially have the second width W2 in the first direction (x direction).

As described above, the body layer 163 may include an epoxy resin. Like the body layer 163, the dam-wall 165 may include an epoxy resin. The SRL 161 may include a silicone-based material having a lower viscosity than that of the body layer 163. However, the materials of the SRL 161, the body layer 163, and the dam-wall 165 are not limited thereto.

For reference, with respect to the viscosity of an epoxy resin and a silicone-based material, the epoxy resin of the body layer 163 may have a viscosity of 90000 cps (@25° C.). The silicone-based material of the SRL 161 may have a viscosity ranging from about 40000 cps to about 80000 cps (@25° C.). Also, the viscosity of the silicon-based material may be adjusted to a required level by adjusting a component or component ratio of a filler included in the silicon-based material. In addition, according to an example embodiment, the SRL 161 may also include an epoxy resin, and the component or component ratio of the filler may be adjusted, so that the viscosity of the epoxy resin may approximate the required level.

As shown in FIG. 2B, the dam 160 may be on the chip body 122 of the image sensor chip 120. The chip body 122 may include a substrate 122-1, a multi-material layer 122-3, and a chip protection layer 122-5. The substrate 122-1 may include, for example, silicon (Si). The multi-material layer 122-3 may include a metal layer such as tungsten (W), a metal oxide film such as aluminum oxide ($Al_2O_3$), a photoresist (PR) layer, a planarization layer, or the like. The chip protection layer 122-5 may entirely cover and protect the chip body 122 by including a micro lens in the pixel area Pla. The chip protection layer 122-5 may be formed through a semiconductor operation at a very low temperature, for example, 300° C. or less. The chip protection layer 122-5 may include, for example, a silicon oxide ($SiO_2$) film. As described above, when a dam only including an epoxy resin is formed through the three-operation curing process, cracks in the chip protection layer 122-5, a delamination phenomenon of the PR layer or the planarization layer of the multi-material layer 122-3, or the like may occur. However, in the image sensor package 100, the above problem may be solved by including the SRL 161 having low viscosity at the lower portion of the dam 160.

Figure 3A:
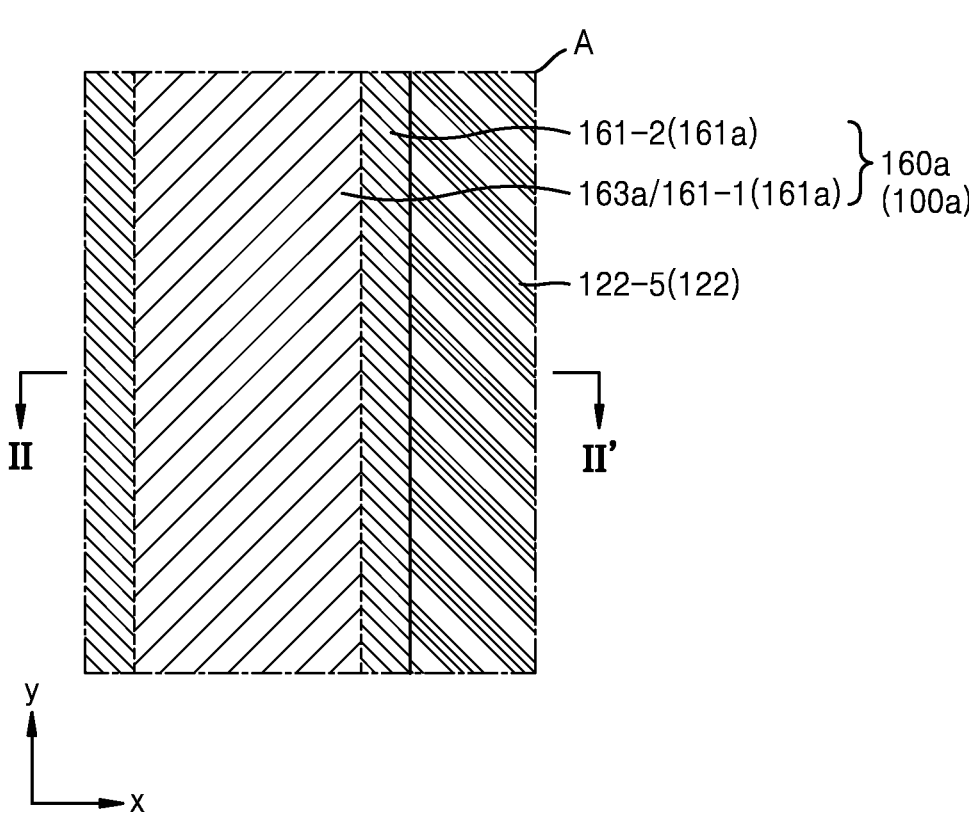
FIGS. 3A and 3B are a plan view and a cross-sectional view, respectively, illustrating an enlarged dam portion in the image sensor package of FIG. 1A.
Figure 3B:
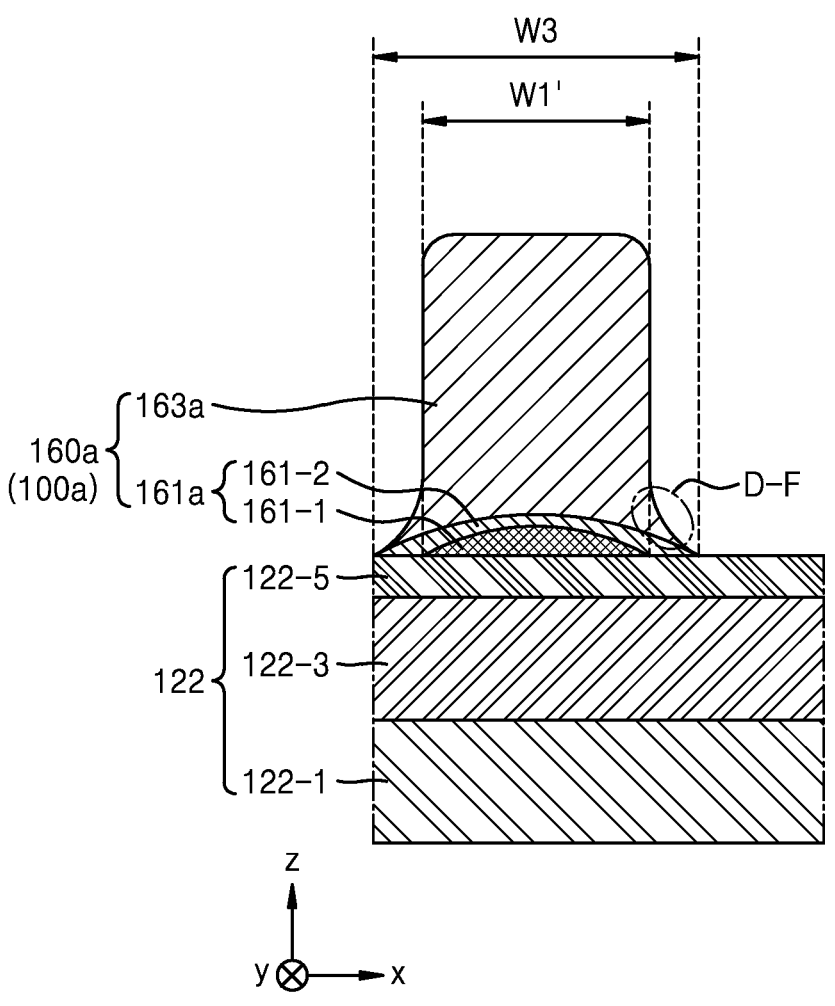

FIGS. 3A and 3B are a plan view and a cross-sectional view, respectively, of a dam portion in the image sensor package of FIG. 1A, wherein FIG. 3A is a plan view of the enlarged region A of FIG. 1B, and FIG. 3B is a cross-sectional view taken along a line II-II' of FIG. 3A. In the plan view, the dam-foot D-F portion is omitted, and an SRL 161a is illustrated outside a body layer 163a. Descriptions will be made with reference to FIGS. 1A and 1B together, and those already given with reference to FIGS. 1A to 2B will be briefly described or omitted.

Referring to FIGS. 3A and 3B, an image sensor package 100a according to an example embodiment may be different from the image sensor package 100 of FIG. 2B in a structure of the dam 160a. In particular, in the image sensor package 100a, the dam 160a may include the SRL 161a and the body layer 163a.

The SRL 161a may be on the chip body 122, and may extend in the first direction (x direction) or the second direction (y direction) corresponding to the shape of the dam 160a. Hereinafter, based on FIG. 3A, the dam 160a is described as having a portion extending in the second direction (y direction).

The SRL 161a may include a first SRL 161-1 and a second SRL 161-2. The first SRL 161-1 and the second SRL 161-2 may both have a lower viscosity than that of the body layer 163a. For example, the first SRL 161-1 and the second SRL 161-2 may both include a silicone-based material. The first SRL 161-1 may have a higher viscosity than that of the second SRL 161-2. For example, the viscosity of the first SRL 161-1 may be greater than the viscosity of the second SRL 161-2 by adjusting a component or component ratio of a filler included in the first SRL 161-1 or the second SRL 161-2.

As shown in FIG. 3B, the second SRL 161-2 may have a greater width than that of the first SRL 161-1 in the first direction (x direction). The second SRL 161-2 may completely cover the first SRL 161-1. For example, the second SRL 161-2 may have a third width W3 in the first direction (x direction), and the third width W3 may be, for example, 350 μm or less. In addition, the first SRL 161-1 may have a first width W1' in the first direction (x direction), and the first width W1' may be, for example, 250 μm or less. However, the first width W1' of the first SRL 161-1 and the third width W3 of the second SRL 161-2 are not limited thereto.

The body layer 163a may be on the SRL 161a, that is, the second SRL 161-2. The body layer 163a may have substantially the same width as that of the first SRL 161-1 in the first direction (x direction). For example, the body layer 163a may have the first width W1' in the first direction (x direction). However, the first width W1' of the body layer 163a is not limited thereto. The width of the body layer 163a in the first direction (x direction) may also be different from the width of the first SRL 161-1.

The dam-foot D-F may be formed at a lower portion of the body layer 163a. As shown in FIG. 3B, the dam-foot D-F may entirely cover the outer portion of the SRL 161a, as shown in FIG. 3B. However, according to an example embodiment, the dam-foot D-F may cover only a portion of the outer portion of the SRL 161a, and the outermost portion of the SRL 161a may also be exposed from the dam-foot D-F.

Figure 4A:
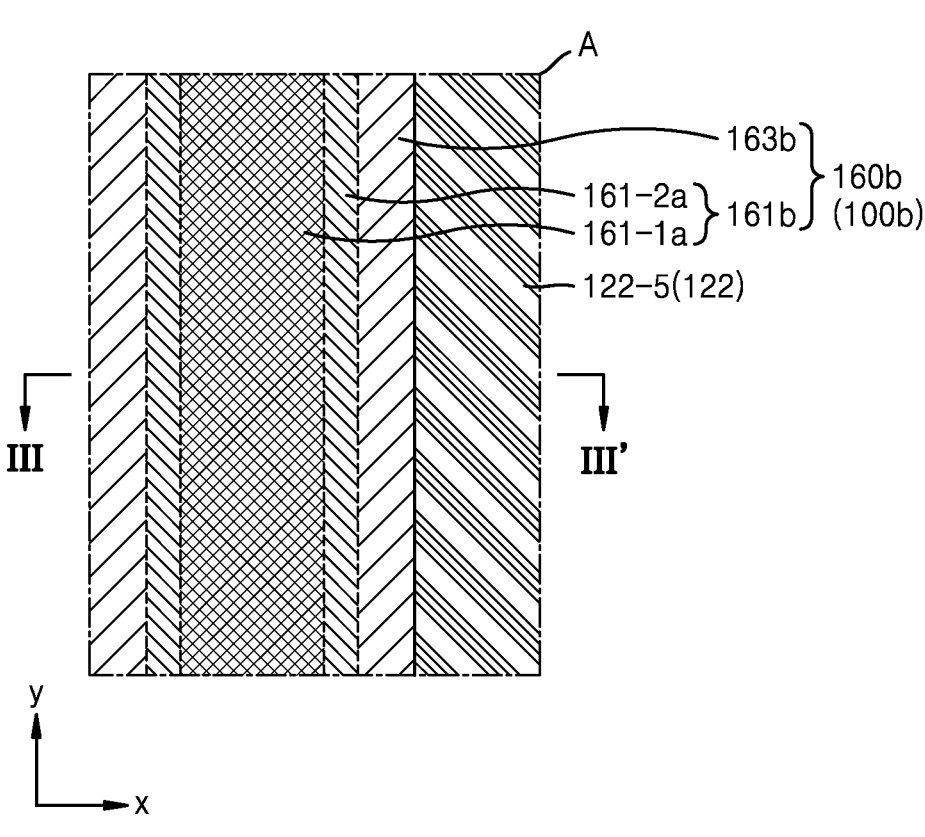
FIGS. 4A and 4B are a plan view and a cross-sectional view, respectively, illustrating an enlarged dam portion in the image sensor package of FIG. 1A.
Figure 4B:
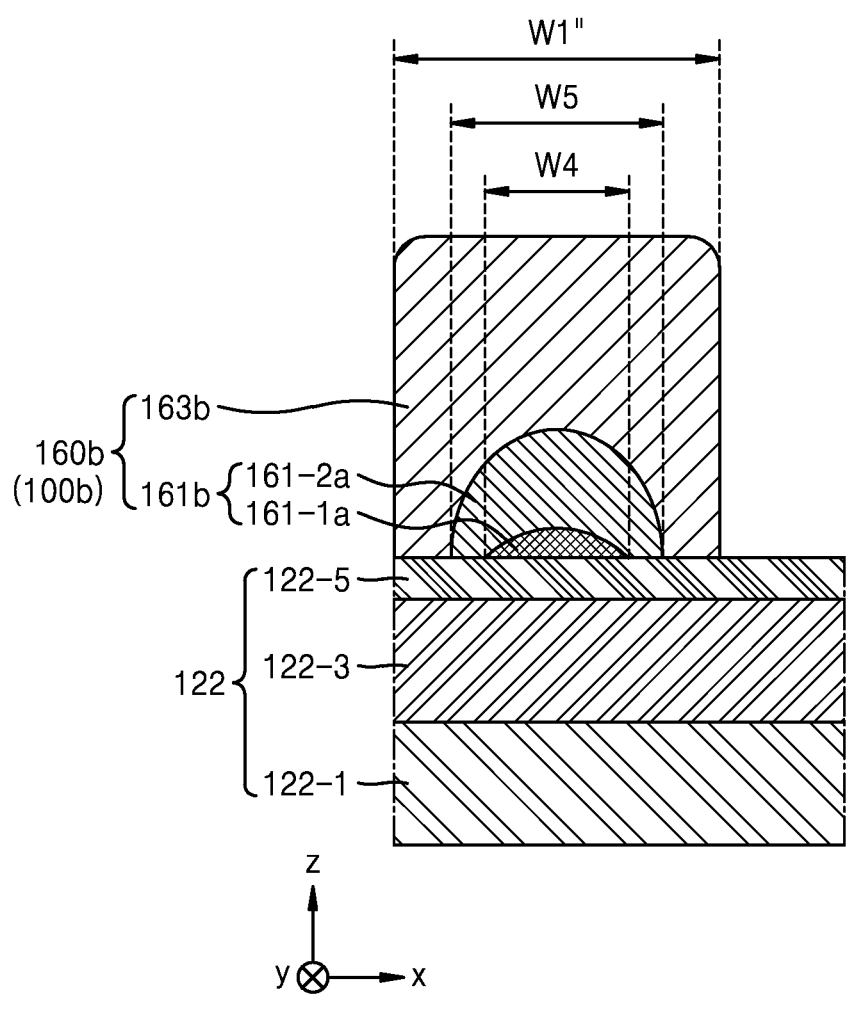

FIGS. 4A and 4B are a plan view and a cross-sectional view, respectively, of a dam portion in the image sensor package of FIG. 1A, wherein FIG. 4A is a plan view of the enlarged region A of FIG. 1B, and FIG. 4B is a cross-sectional view taken along a line III-III' of FIG. 4A. In the plan view, an SRL 161b is covered with a body layer 163b, but is shown for comparison with the body layer 163b. Descriptions will be made with reference to FIGS. 1A and 1B together, and those already given with reference to FIGS. 1A to 3B will be briefly described or omitted.

Referring to FIGS. 4A and 4B, an image sensor package 100b may be different from the image sensor package 100 of FIG. 2B in a structure of a dam 160b. In particular, in the image sensor package 100b, the dam 160b may include the SRL 161b and the body layer 163b.

The SRL 161b may be on the chip body 122, and may extend in the first direction (x direction) or the second direction (y direction) corresponding to the shape of the dam 160b. Hereinafter, based on FIG. 4A, the dam 160b is described as having a portion extending in the second direction (y direction).

The SRL 161b may include a first SRL 161-1a and a second SRL 161-2a. The first SRL 161-1a and the second SRL 161-2a may both have a lower viscosity than that of the body layer 163b. For example, the first SRL 161-1a and the second SRL 161-2a may both include a silicone-based material. The first SRL 161-1a may have a higher viscosity than that of the second SRL 161-2a. For example, the viscosity of the first SRL 161-1a may be greater than the viscosity of the second SRL 161-2a by adjusting a component or component ratio of a filler included in the first SRL 161-1a or the second SRL 161-2a.

As shown in FIG. 4B, the second SRL 161-2a may have a greater width than that of the first SRL 161-1a in the first direction (x direction). Also, the second SRL 161-2a may completely cover the first SRL 161-1a. For example, the second SRL 161-2a may have a fifth width W5 in the first direction (x direction), and the fifth width W5 may be, for example, 200 μm or less. Also, the first SRL 161-1a may have a fourth width W4 in the first direction (x direction), and the fourth width W4 may be, for example, 150 μm or less. However, the fourth width W4 of the first SRL 161-1a and the fifth width W5 of the second SRL 161-2a are not limited thereto.

The body layer 163b may be on the SRL 161b, that is, the second SRL 161-2a. Also, the body layer 163b may have a greater width than that of the second SRL 161-2a in the first direction (x direction), and may entirely cover the SRL 161*b*. For example, the body layer 163*b* may have a first width W1" in the first direction (x direction). The first width W1" may be, for example, 350 μm or less. However, the first width W1" of the body layer 163*a* is not limited thereto.

The image sensor packages 100, 100*a*, and 100*b* respectively including the structures of three kinds of dams 160, 160*a*, and 160*b* have been described, but example embodiments are not limited thereto. For example, as long as a dam has a structure including an SRL having low viscosity at a lower portion thereof and a body layer at an upper portion thereof, an image sensor package including the dam may correspond to example embodiments.

Figure 5A:
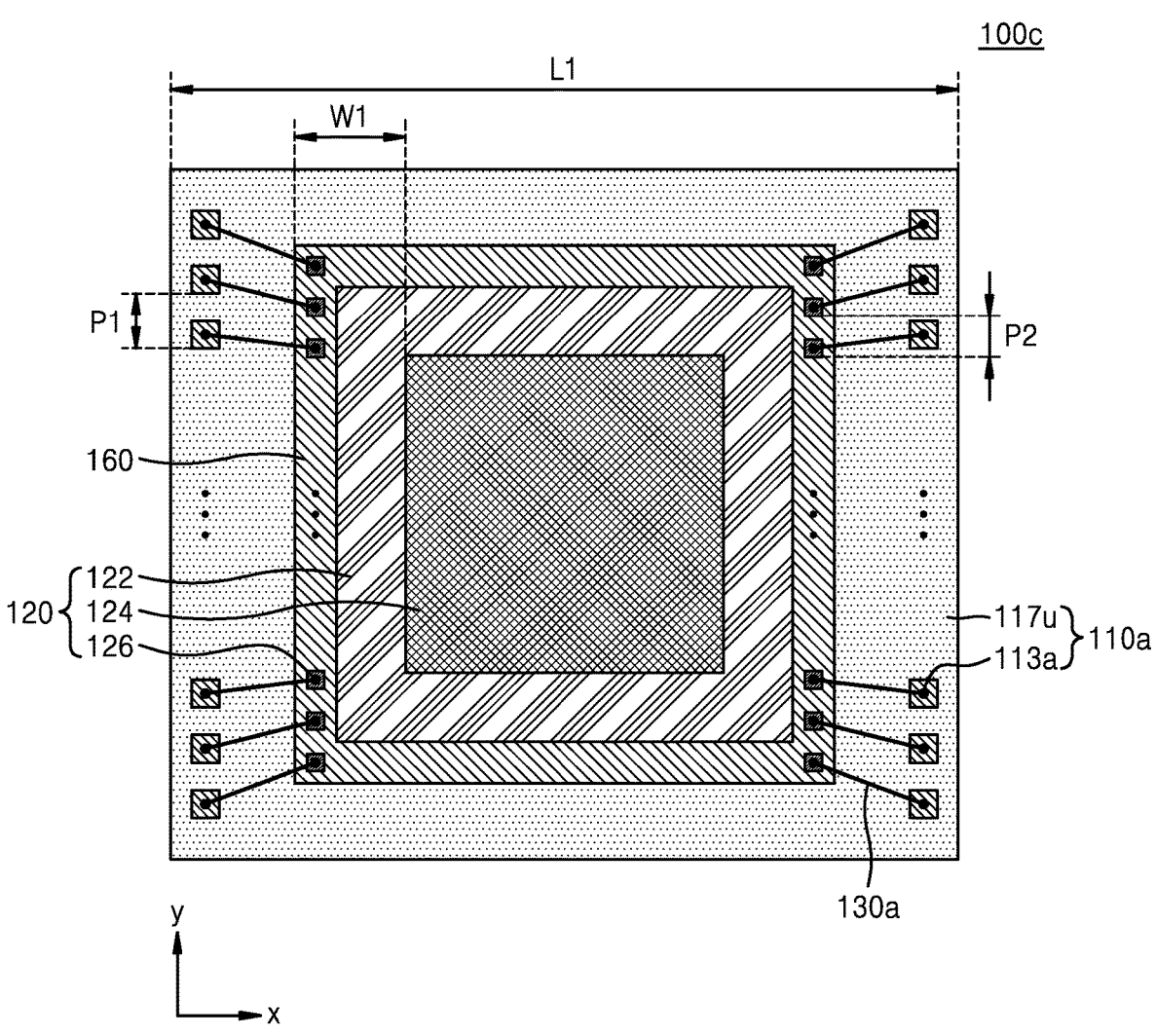
FIGS. 5A and 5B are plan views of an image sensor package according to example embodiments.
Figure 5B:
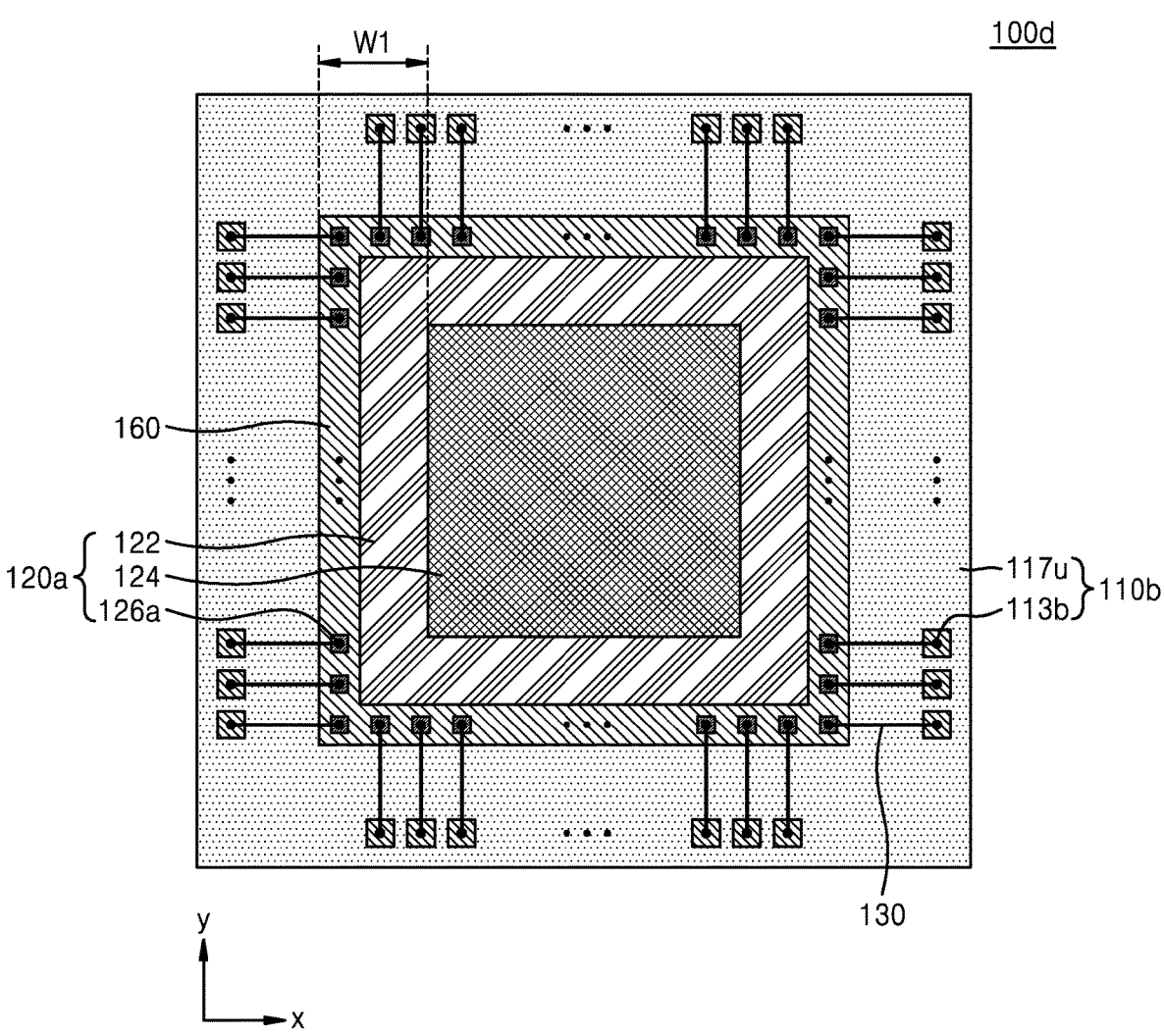

FIGS. 5A and 5B are plan views of an image sensor package according to example embodiments. Descriptions already given with reference to FIGS. 1A to 4B are briefly given below or omitted.

Referring to FIG. 5A, an image sensor package 100*c* of an example embodiment may be different from the image sensor package 100 of FIG. 1B in the arrangement structure of an upper substrate pad 113*a* of a package substrate 110*a* and a wire-bonding structure thereof. In particular, in the image sensor package 100*c*, the upper substrate pad 113*a* may be arranged to have a wider pitch than that of the chip pad 126 of the image sensor chip 120. For example, the upper substrate pad 113*a* may have a first pitch P1 in the second direction (y direction), and the chip pad 126 may have a second pitch P2, which is less than the first pitch P1, in the second direction (y direction). For reference, in the image sensor package 100 of FIG. 1B, pitches of the upper substrate pad 113 and the chip pad 126 in the second direction (y direction) may be substantially the same as each other. As the first pitch P1 of the upper substrate pad 113*a* is greater than the second pitch P2 of the chip pad 126, the wire-bonding structure may have a shape in which the length of a bonding wire 130*a* increases toward both outer portions of the package substrate 110*a* in the second direction (y direction) and spreads in a fan shape.

Referring to FIG. 5B, an image sensor package 100*d* of an example embodiment may be different from the image sensor package 100 of FIG. 1B in that a package substrate 110*b* of the image sensor package 100*d* has square shape. Also, in the image sensor package 100*d*, the image sensor package 100*d* may be different from the image sensor package 100 of FIG. 1B in that an upper substrate pad 113*b* of the package substrate 110*b* and a chip pad 126*a* of an image sensor chip 120*a* are arranged on four sides of the image sensor package 100*d*, and wire bonding is also formed on all four sides of the image sensor package 100*d*.

In the image sensor package 100*d*, the package substrate 110*b* may have a square shape in a plan view. In addition, the upper substrate pad 113*b* may be arranged on all four sides of outer portions of an upper surface of the package substrate 110*b*. In this regard, the upper substrate pad 113*b* may be arranged, in the second direction (y direction), on both sides of the package substrate 110*b* in the first direction (x direction), and may also be arranged, in the first direction (x direction), on both sides of the package substrate 110*b* in the second direction (y direction). The image sensor chip 120*a* may also have a square shape in a plan view, and the chip pad 126*a* may be arranged on all four sides of outer portions of the upper surface of the image sensor chip 120*a*. According to an example embodiment, at least one of the package substrate 110*b* and the image sensor chip 120*a* may also have a rectangular shape long in one direction, for example, the first direction (x direction).

The wire-bonding structure may have a structure in which the upper substrate pad 113*b* of the package substrate 110*b* is connected to the chip pad 126*a* of the image sensor chip 120*a*, which corresponds to the upper substrate pad 113*b*, through the bonding wire 130. Also, the wire-bonding structure may be formed over all four sides of the package substrate 110*b* and the image sensor chip 120*a* corresponding to the arrangement structures of the upper substrate pad 113*b* and the chip pad 126*a*, respectively.

In the image sensor package 100*d*, the pitches of the upper substrate pad 113*b* and the chip pad 126*a* may be substantially the same as each other. Accordingly, as shown in FIG. 5B, the bonding wires 130 may extend parallel to each other in the first direction (x direction) or the second direction (y direction). However, according to an example embodiment, the pitch of the upper substrate pad 113*b* may be greater than the pitch of the chip pad 126*a*, and in this case, a wire-bonding structure may also be formed in a form in which the bonding wires 130 are spread in a fan shape, as in the image sensor package 100*c* of FIG. 5A.

Figure 6A:
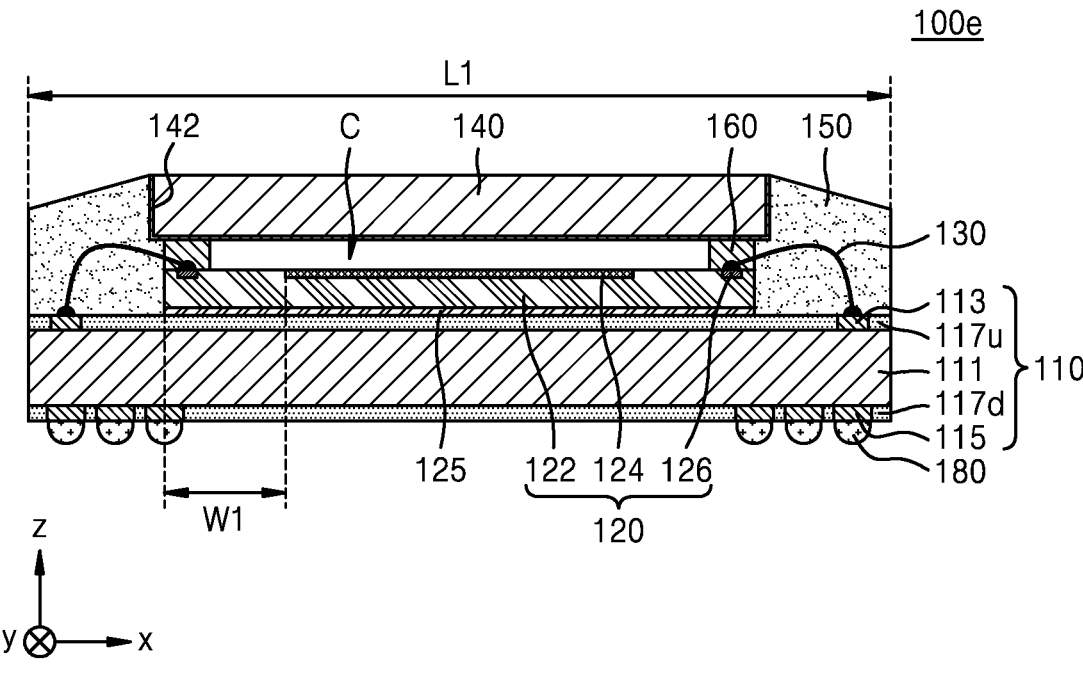
FIGS. 6A, 6B and 6C are cross-sectional views of an image sensor package according to example embodiments.
Figure 6B:
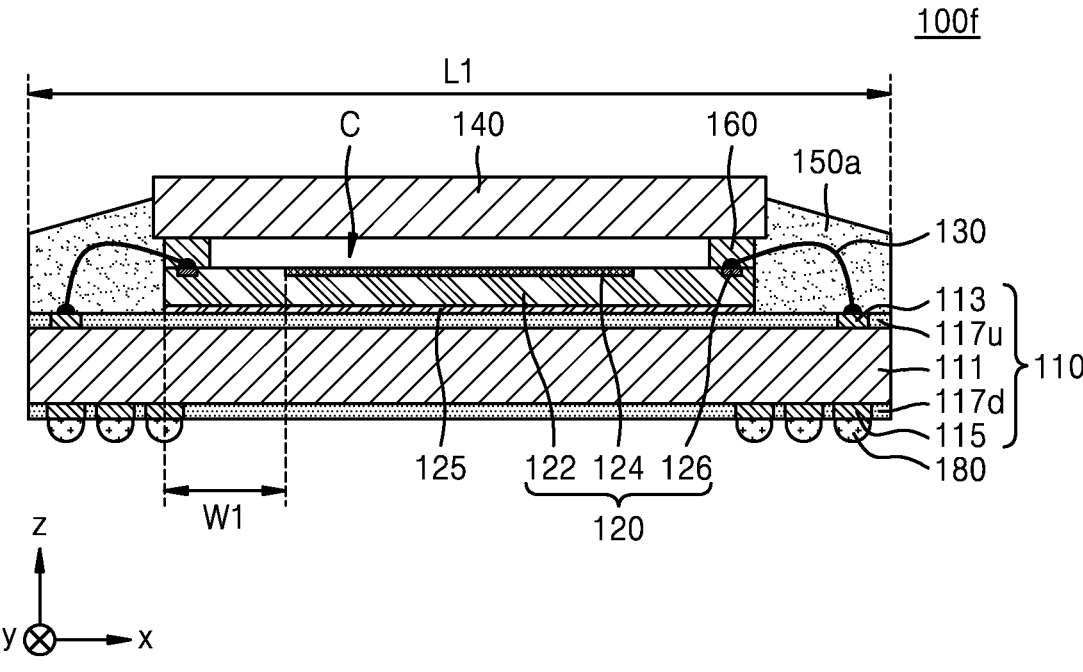
Figure 6C:
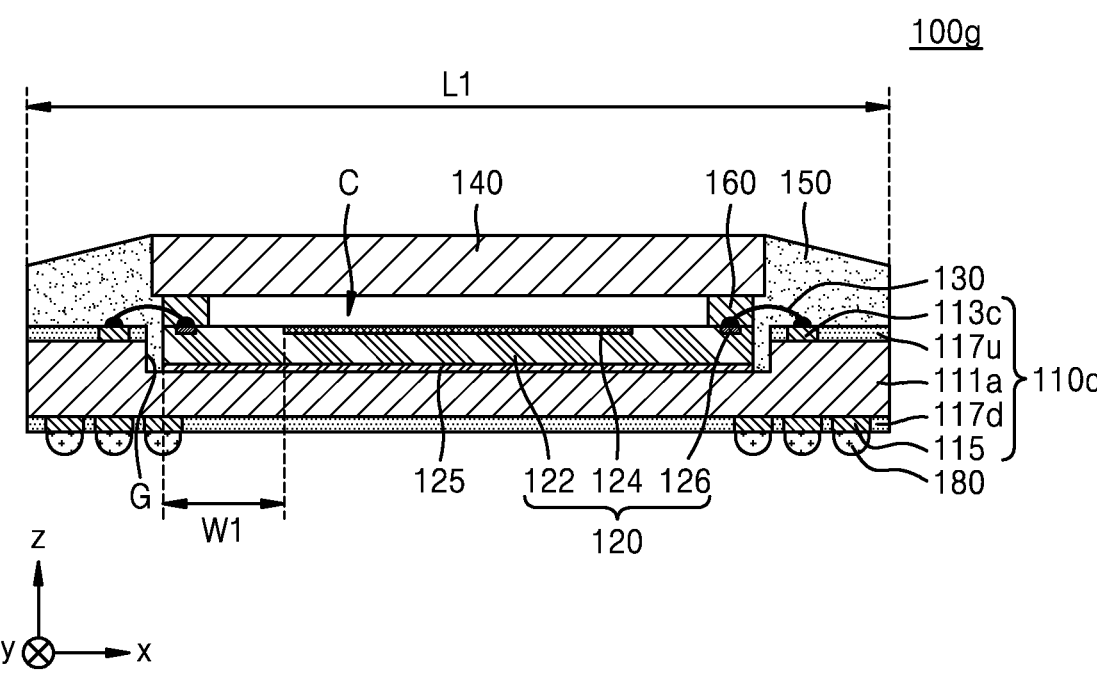

FIGS. 6A to 6C are cross-sectional views of an image sensor package according to example embodiments. Descriptions already given with reference to FIGS. 1A to 5B are briefly given below or omitted.

Referring to FIG. 6A, an image sensor package 100*e* according to an example embodiment may be different from the image sensor package 100 of FIG. 1A in that a coating layer 142 is further included on the transparent cover 140. In particular, in the image sensor package 100*e*, the coating layer 142 may be formed on the lower surface and side surfaces of the transparent cover 140. The coating layer 142 may perform various functions. For example, the coating layer 142 may block infrared rays. When the coating layer 142 blocks infrared rays, an infrared (IR) filter that blocks IR rays in a camera device or the like may be omitted. Also, the coating layer 142 may improve transmittance or prevent reflection. For example, the coating layer 142 may be a blue filter coating layer or an anti-reflection coating layer. However, the coating layer 142 is not limited thereto.

Referring to FIG. 6B, an image sensor package 100*f* of an example embodiment may be different from the image sensor package 100 of FIG. 1A in a structure of a sealing material 150*a*. In particular, in the image sensor package 100*f*, the sealing material 150*a* may cover only a portion of the side surface of the transparent cover 140. For example, the sealing material 150*a* may cover only a lower portion of the side surface of the transparent cover 140, and an upper portion of the side surface of the transparent cover 140 may be exposed from the sealing material 150*a*. In general, in a process of covering the entire side surface of the transparent cover 140 with the sealing material 150*a*, an overflow defect in which the sealing material 150*a* covers an upper surface of the transparent cover 140 may occur. Accordingly, the overflow defect may be prevented in advance by allowing the sealing material 150*a* to cover only a portion of the side surface of the transparent cover 140 from the beginning.

Referring to FIG. 6C, an image sensor package 100*g* of an example embodiment may be different from the image sensor package 100 of FIG. 1A in a structure of a package substrate 110*c*, and a mounting structure and a wire-bonding structure of the image sensor chip 120 according to the structure of the package substrate 110*c*. In particular, in the image sensor package 100*g*, a groove G may be formed in a central portion of the package substrate 110*c*. Also, the image sensor chip 120 may be arranged in the groove G, and may be adhered to and mounted in the groove G through the adhesive layer 125.

An upper substrate pad 113*c* may be arranged, in the second direction (y direction), on the package substrate 110*c* at both outer portions thereof in the first direction (x direction). However, as the image sensor chip 120 is arranged in the groove G of the package substrate 110c, upper surfaces of the image sensor chip 120 and the package substrate 110c may have similar heights. Also, the upper substrate pad 113c of the package substrate 110c may maintain substantially the same height as that of the chip pad 126 of the image sensor chip 120. As described above, as the upper substrate pad 113c and the chip pad 126 maintain substantially the same heights, the upper substrate pad 113c may be arranged closer to the image sensor chip 120, and accordingly, the length of the bonding wire 130 may be reduced, and the stress of the bonding wire 130 may be reduced.

In the image sensor package 100g, as the image sensor chip 120 is arranged in the groove G of the package substrate 110c, the height of an upper surface of the transparent cover 140 may be lowered by a depth of the groove G, and the thickness of the sealing material 150 may also be reduced. Accordingly, the entire thickness of the image sensor package 100g may be reduced. As a result, the image sensor package 100g may contribute to implementing an image sensor package having a thin thickness.

Figure 7:
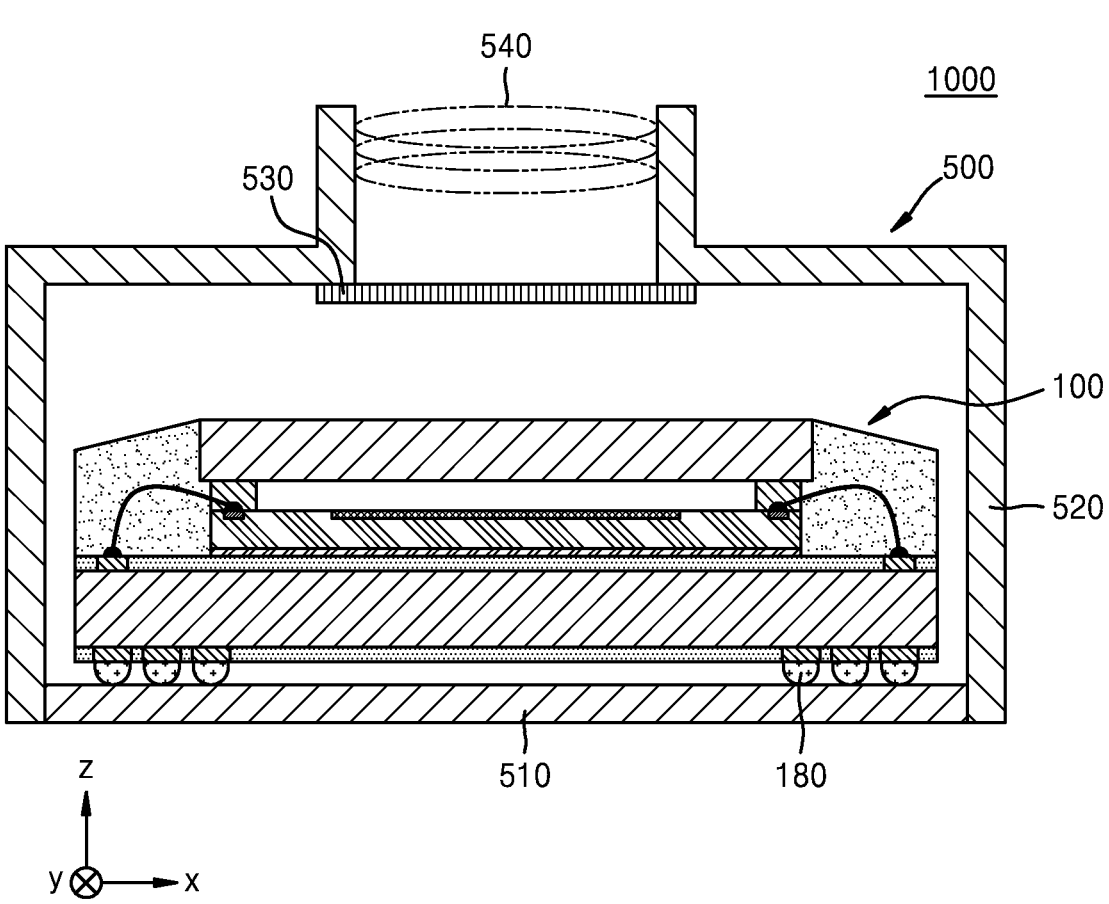
FIG. 7 is a cross-sectional view of a camera device including an image sensor package according to an example embodiment.

FIG. 7 is a cross-sectional view of a camera device including an image sensor package according to an example embodiment. Description will be given with reference to FIGS. 1A and 6C together, and description previously given with reference to FIGS. 1A and 6B will be briefly given or omitted.

Referring to FIG. 7, a camera device 1000 according to an example embodiment may include the image sensor package 100 and a camera external portion 500. In the camera device 1000, the image sensor package 100 may be the image sensor package 100 of FIG. 1A. However, example embodiments are not limited thereto, and the camera device 1000 use any one of the image sensor packages 100a to 100g of FIGS. 3A, 4A, and 5A to 6C.

The camera external portion 500 may include an external substrate 510, a housing 520, a filter 530, and a lens 540. The image sensor package 100 may be mounted on the external substrate 510 though the external connection terminal 180. The external connection terminal 180 may be, for example, a solder ball. The image sensor package 100 may be electrically connected to the external substrate 510 through a solder ball. The external substrate 510 may include a circuit for performing an additional function or connecting to another device. When a substrate does not need to be separately manufactured, the external substrate 510 may form a portion of the housing 520.

The housing 520 may surround the image sensor package 100 and protect the image sensor package 100 from physical impacts from the outside. In addition, the housing 520 may also shield penetration of disturbance into the image sensor package 100 by including an electro-magnetic interference (EMI) shielding material.

The filter 530 may be arranged at an entrance side of the housing 520, in which the lens 540 is arranged, and may be arranged to be spaced apart from the image sensor package 100 by a certain distance. The filter 530 may be, for example, an infrared cut-off filter, that is, an IR filter. According to an example embodiment, the filter 530 may be provided as a separate component from the camera external portion 500. Also, as described above, when the coating layer 142 having a function of blocking IR rays is formed on the transparent cover 140, the filter 530 may be omitted.

The lens 540 may be positioned at the entrance portion of the housing 520, that is, a barrel portion, and may refract light introduced from the outside to allow the light to be incident on the image sensor package 100. In this regard, the light introduced from the outside may be focused on the sensor 124 of the image sensor chip 120 of the image sensor package 100 through the lens 540. As shown in FIG. 7, a plurality of lens 540 may be arranged in the barrel portion.

According to an example embodiment, the camera device 1000 may be applied to various fields. For example, the camera device 1000 may be applied to front and rear cameras of a vehicle. In the field of image sensor packages for vehicles, mandatory installation of rear cameras is in progress around the world, and image sensor packages for vehicles have become more important in autonomous driving be being linked to a driving system, beyond the role of parking assistance. Accordingly, the reliability of the image sensor packages for vehicles has emerged as a more important issue.

As described above, in the image sensor package 100 of the camera device 1000, the dam 160 may have the SRL 161 at a lower portion thereof and the body layer 163 at an upper portion thereof, and the SRL 161 may also have a lower viscosity than that of the body layer 163. Accordingly, in the three-operation curing process of the body layer 163, stress applied to a lower layer of the dam 160 is relieved, and defects such as cracks in the lower layer and a delamination phenomenon of lower layers are prevented, and thus, the reliability of the image sensor package 100 may be improved. As a result, the camera device 1000 may have the image sensor package 100 with high reliability, and may be usefully used in a camera for vehicles.

FIGS. 8A to 8F are cross-sectional views schematically illustrating a process of fabricating the image sensor package of FIG. 1A, according to an example embodiment.

Figure 8A:
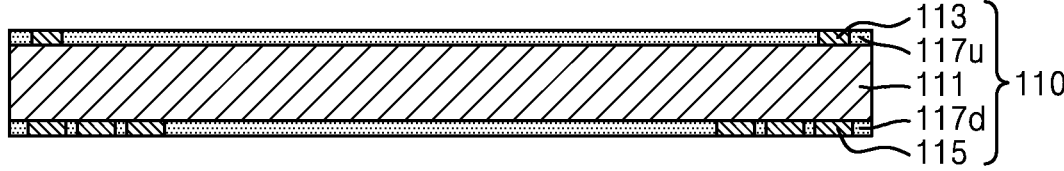
FIGS. 8A, 8B, 8C, 8D, 8E and 8F are cross-sectional views schematically illustrating a process of fabricating the image sensor package of FIG. 1A, according to an example embodiment.
Figure 8A:
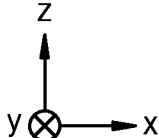

Referring to FIG. 8A, in a method of fabricating an image sensor package according to an example embodiment, the package substrate 110 is prepared. The package substrate 110 may include the substrate body 111, the upper substrate pad 113, the lower substrate pad 115, and the protective layers 117u and 117d. The substrate body 111 may include single-layered or multi-layered wires, and the upper substrate pad 113 may be electrically connected to the lower substrate pad 115 corresponding thereto through the wires of the substrate body 111. The package substrate 110 shown in FIG. 8A may be a portion of a large-area substrate including a plurality of package substrates 110 together.

The upper substrate pad 113 may be arranged on the upper surface of the package substrate 110, and may be arranged, in the second direction (y direction) at outer portions on both sides of the package substrate 110 in the first direction (x direction). The lower substrate pad 115 may be formed on the lower surface of the substrate body 111, and may be arranged in three rows. However, according to an example embodiment, the lower substrate pad 115 may be arranged in two or at least four rows, or may be arranged in a two-dimensional array structure over the entire lower surface of the substrate body 111. The upper substrate pad 113 and the lower substrate pad 115 through the protective layers 117u and 117d may be respectively exposed from the protective layers 117u and 117d.

Figure 8B:
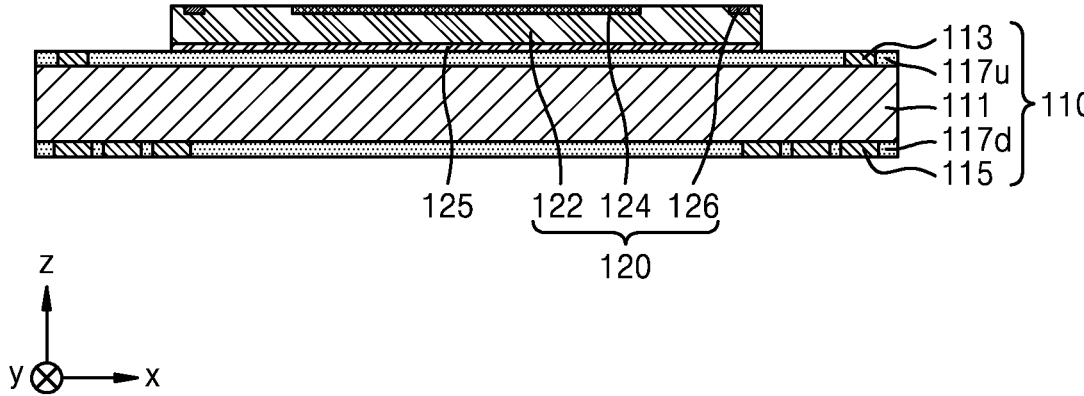

Referring to FIG. 8B, the adhesive layer 125 may be formed by coating an adhesive on the upper surface of the package substrate 110. The adhesive layer 125 may be formed on a central portion of the upper surface of the package substrate 110 to correspond a mounting position of the image sensor chip 120. The adhesive layer 125 may be formed by coating a fluid adhesive through a dispenser or the like and curing the fluid adhesive to some extent, or may be formed by attaching an adhesive film to the central portion of the upper surface of the package substrate 110.

Subsequently, the image sensor chip 120 is mounted on the package substrate 110. The image sensor chip 120 may be attached and fixed through the adhesive layer 125. The image sensor chip 120 may include the chip body 122, the sensor 124, and the chip pad 126. The chip body 122 may include a substrate and a wire layer of the image sensor chip 120. The sensor 124 may include a pixel area PIa having a plurality of pixels, and the plurality of pixels may be arranged in a two-dimensional array structured in the pixel area PIa. Each of the plurality of pixels in the pixel area PIa may include a PD formed in a substrate. The sensor 124 may be arranged at a central portion of the image sensor chip 120. The chip pad 126 may be arranged in the peripheral area PEa of the image sensor chip 120. The chip pad 126 may be arranged, in the second direction (y direction) at outer portions of the peripheral areas PEa on both sides of the image sensor chip 120 in the first direction (x direction).

Figure 8C:
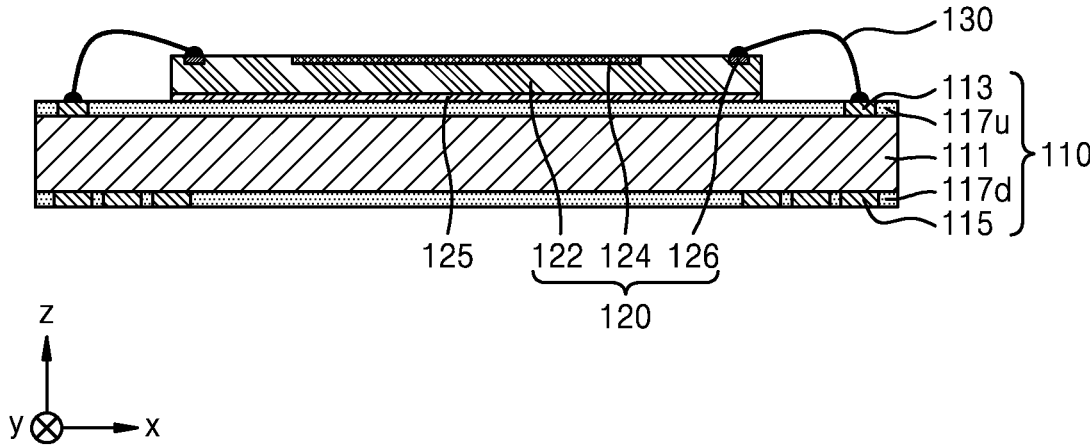

Referring to FIG. 8C, a wire-bonding process of connecting the chip pad 126 of the image sensor chip 120 to the upper substrate pad 113 of the package substrate 110, which corresponds to the chip pad 126, through the bonding wire 130 is performed. The wire-bonding process may be, for example, performed by using a capillary. Through the wire-bonding process, the first end of the bonding wire 130 may be connected to the chip pad 126, and the second end of the bonding wire 130 may be connected to the upper substrate pad 113. In the method of fabricating the image sensor package, the bonding wire 130 may include, for example, Au. However, the material of the bonding wire 130 is not limited to Au.

Figure 8D:
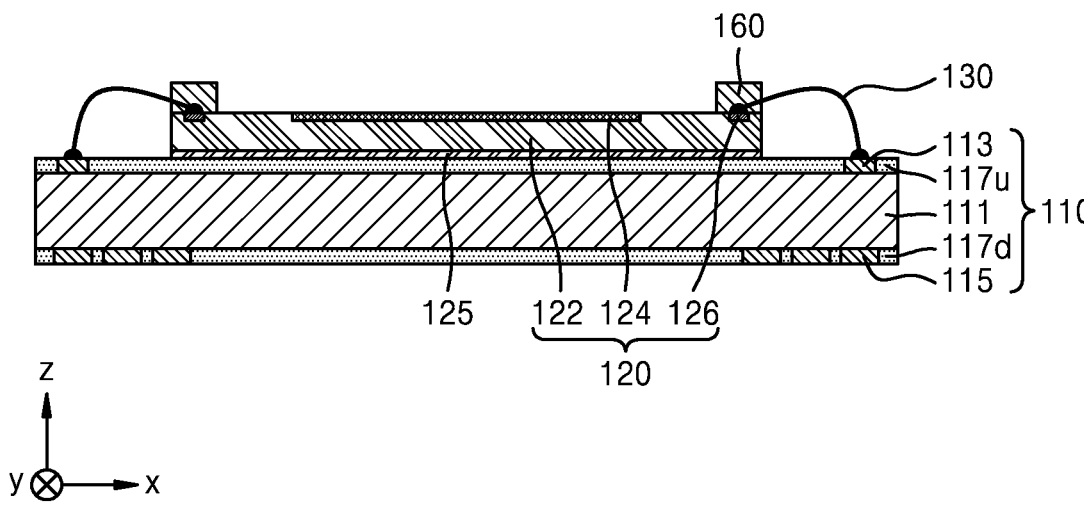

Referring to FIG. 8D, the dam 160 is formed on the upper surface of the image sensor chip 120. The dam 160 may be formed by a dispensing method using a dispenser. As shown in FIG. 1B, the dam 160 may be formed to surround the outer portion of the upper surface of the image sensor chip 120 and have a rectangular ring shape. The dam 160 may cover the chip pad 126 of the image sensor chip 120 and the first end of the bonding wire 130 connected to the chip pad 126. The dam 160 may be formed in a structure including the SRL 161 at a lower portion thereof and the body layer 163 at an upper portion thereof. More particular methods of forming the dam 160 are described in more detail with reference to FIGS. 9A to 11C.

Figure 8E:
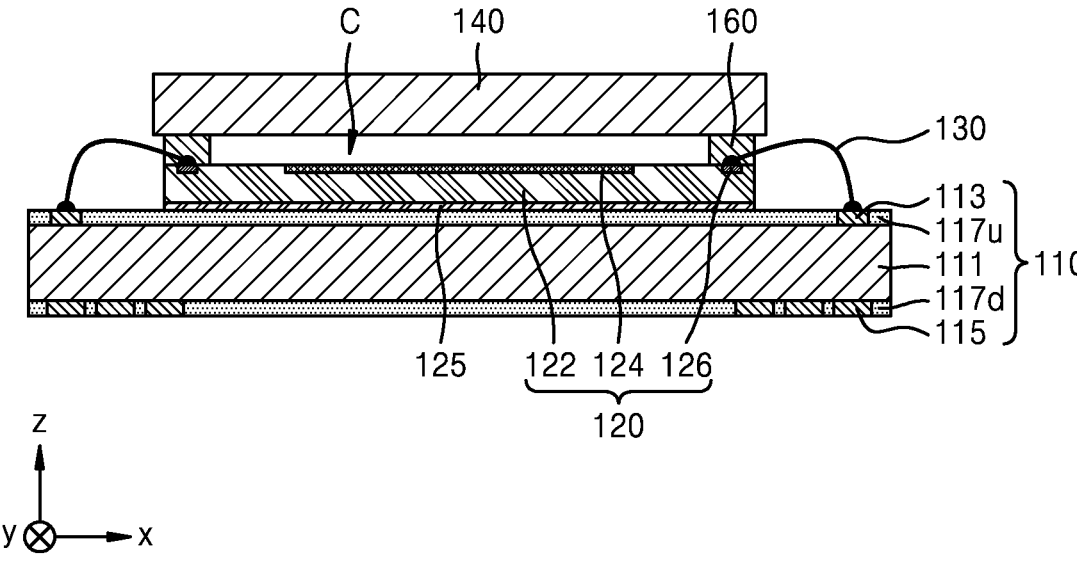

Referring to FIG. 8E, the transparent cover 140 is stacked on the dam 160. For example, the stacking of the transparent cover 140 on the dam 160 may be performed while heat and pressure are applied. The dam 160 may be attached to the transparent cover 140 through viscosity and may seal the cavity C. As described above, the transparent cover 140 and the dam 160 seal the cavity C, so that moisture or foreign materials may be prevented from being introduced to the sensor 124 of the image sensor chip 120 from the outside.

Figure 8F:
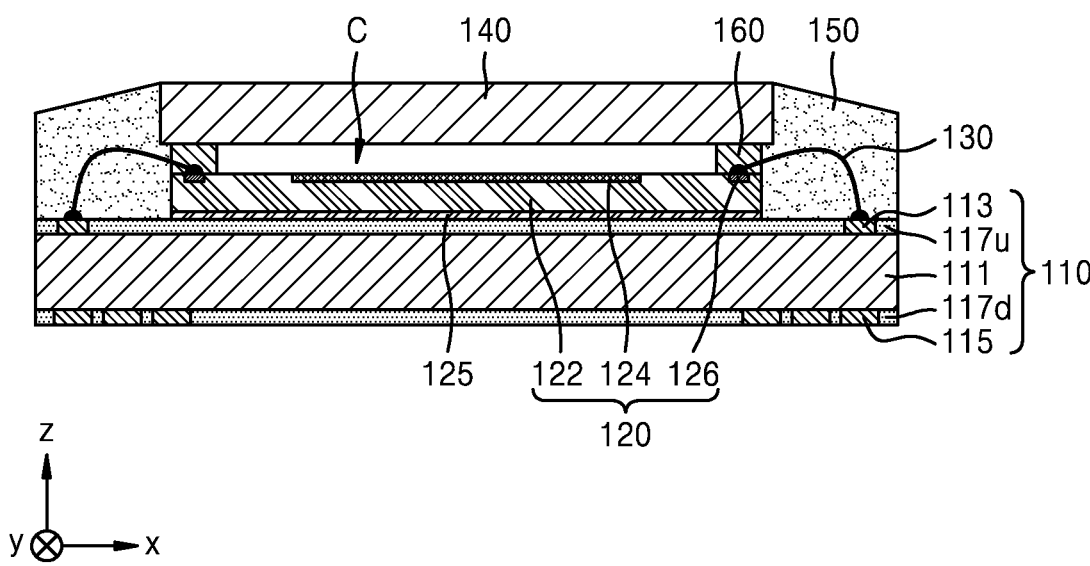

Referring to FIG. 8F, the sealing material 150 may be coated on the package substrate 110 to seal the image sensor chip 120, the bonding wire 130, and the transparent cover 140. The sealing material 150 may cover side surfaces of the image sensor chip 120 and the dam 160. The sealing material 150 may cover the side surfaces and a portion the lower surface of the transparent cover 140. The sealing material 150 may prevent the sensor 124 of the image sensor chip 120 from being contaminated by external foreign materials, and may also protect the image sensor package 100 from external impact.

Subsequently, the external connection terminal 180 (refer to FIG. 7) is attached on the lower substrate pad 115 on the lower surface of the package substrate 110. The external connection terminal 180 may be, for example, a solder ball. The processes described with reference to FIGS. 8A to 8F may be performed on a large-area substrate including the plurality of package substrates 110 together. According, after the external connection terminal 180 is formed, a singulation process may be performed on the large-area substrate. After the singulation process is performed, the image sensor package 100 of FIG. 1A may be completed.

Figure 9A:
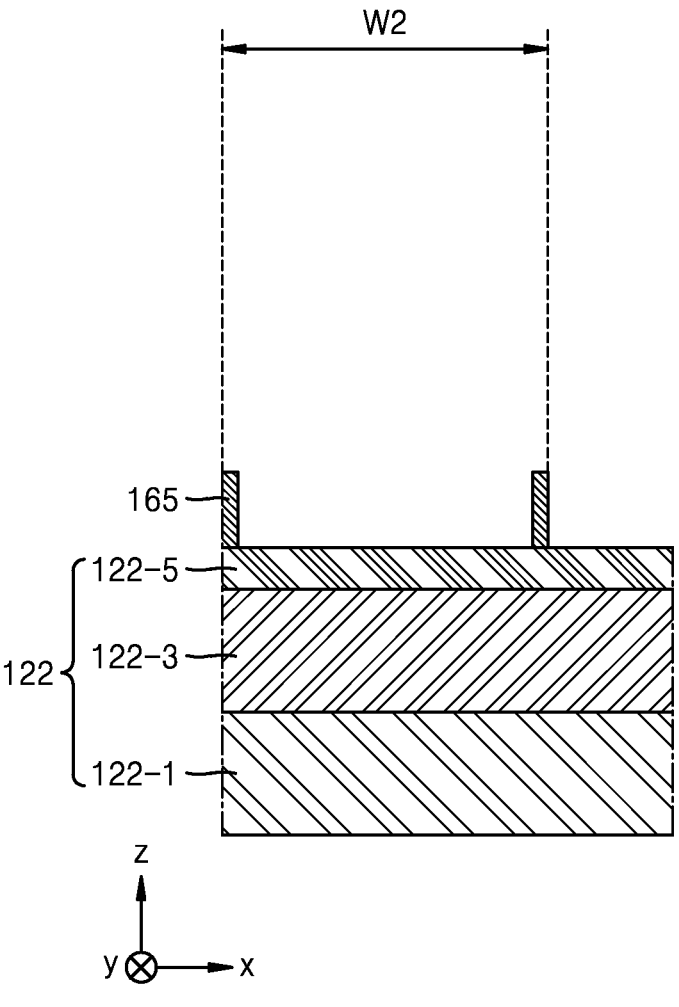
FIGS. 9A, 9B and 9C are cross-sectional views illustrating in more detail a process of forming a dam shown in FIG. 8D, according to an example embodiment.
Figure 9B:
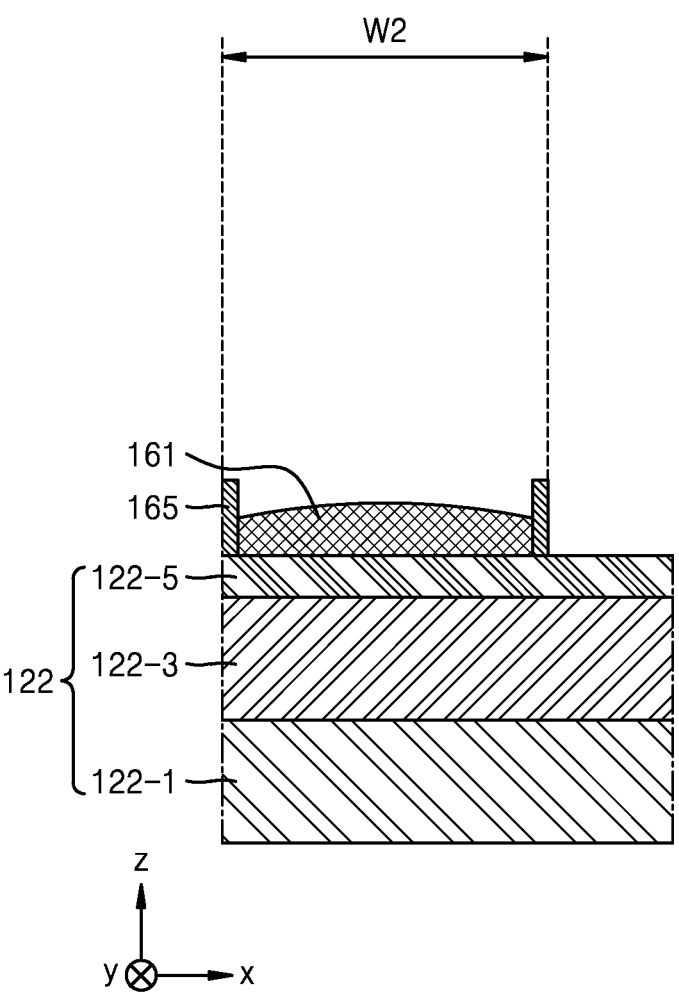
Figure 9C:
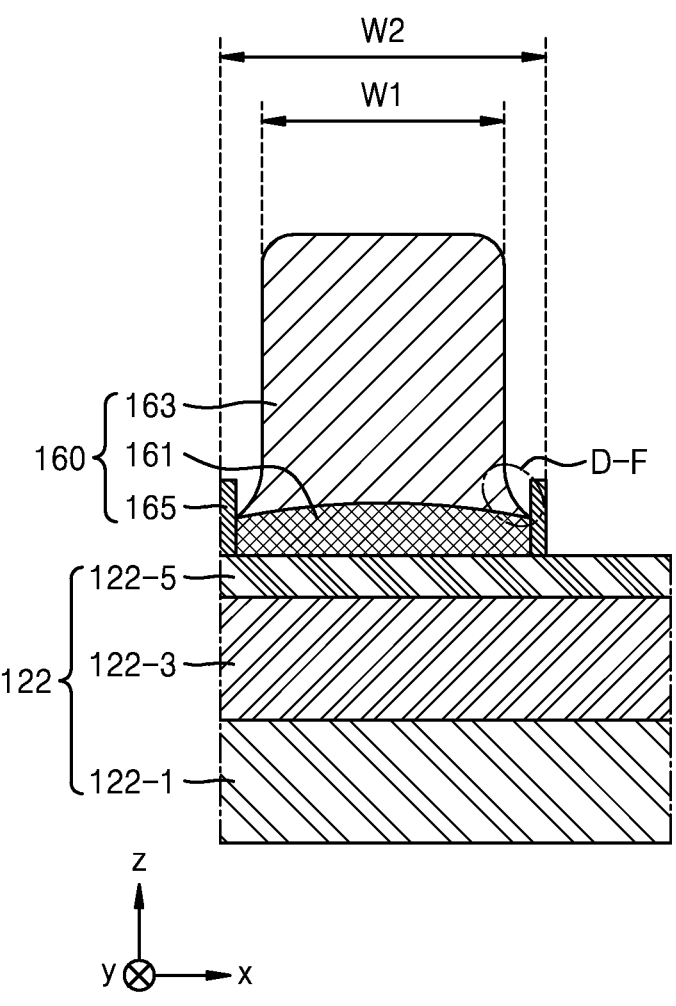

FIGS. 9A to 9C are cross-sectional views illustrating in more detail a process of forming a dam shown in FIG. 8D, according to an example embodiment. Description will be given with reference to FIGS. 2B, and descriptions previously given with reference to FIGS. 2A and 2B are briefly given or omitted.

Referring to FIG. 9A, in a method of fabricating the image sensor package 100, the process of forming the dam 160 of FIG. 8D includes forming the dam-wall 165 on the chip body 122 of the image sensor chip 120. Two dam-walls 165 may be formed to extend in the first direction (x direction) or the second direction (y direction) corresponding to the shape of the dam 160 and to be spaced apart from each other by a certain distance in a direction perpendicular to the extension direction, for example, the second direction (y direction) or the first direction (x direction). Hereinafter, the dam 160 is described as having a portion extending in the second direction (y direction). An interval between the two dam-walls 165 in the first direction (x direction) may have a second width W2. The second width W2 may be, for example, 350 μm or less. However, the interval between the two dam-walls 165 is not limited thereto.

The dam-wall 165 may be formed by a dispensing method using a dispenser. Also, the dam-wall 165 may have a very thin width in the direction perpendicular to the extension direction by performing rapid curing through UV irradiation. The dam-wall 165 may include an epoxy resin as described above. However, the material of the dam-wall 165 is not limited to an epoxy resin.

Referring to FIG. 9B, after the two dam-walls 165 are formed, the SRL 161 is formed on the chip body 122 and between the two dam-walls 165. The SRL 161 may also extend in the second direction (y direction) corresponding to the shape of the dam 160. When a width of each of the two dam-walls 165 is very thin, a width of the SRL 161 in the first direction (x direction) may be substantially equal to the second width W2. As shown in FIG. 9B, a thickness of the SRL 161 in the third direction (z direction) may be less than the thickness of the dam-wall 165. Also, the SRL 161 may have a shape in which a center thereof in the first direction (x direction) is thick and outer portions on both sides thereof are thin. However, according to an example embodiment, the SRL 161 may also have a uniform thickness in the first direction (x direction).

The SRL 161 may be formed by a dispensing method using a dispenser. As described above, the SRL 161 may include a material having a lower viscosity than that of the body layer 163. For example, the SRL 161 may include a silicone-based material.

Referring to FIG. 9C, after the SRL 161 is formed, the body layer 163 is formed on the SRL 161. The body layer 163 may occupy most of the portions of the dam 160, and may extend in the second direction (y direction) corresponding to the shape of the dam 160. The width of the body layer 163 in the first direction (x direction) may have the first width W1. The first width W1 may be, for example, 300 μm or less. However, the first width W1 of the body layer 163 is not limited thereto.

The body layer 163 may be formed by a dispensing method using a dispenser. The body layer 163 may include, for example, an epoxy resin. However, the material of the body layer 163 is not limited to an epoxy resin. The body layer 163 may be cured through a three-operation curing process. The three-operation curing process is the same as previously described with reference to FIG. 1A. When the body layer 163 is formed, the dam-foot D-F may be formed at a lower portion of the body layer 163. Through the formation of the body layer 163, the dam 160 of the image sensor package 100 of FIG. 1A may be completed.

Figure 10A:
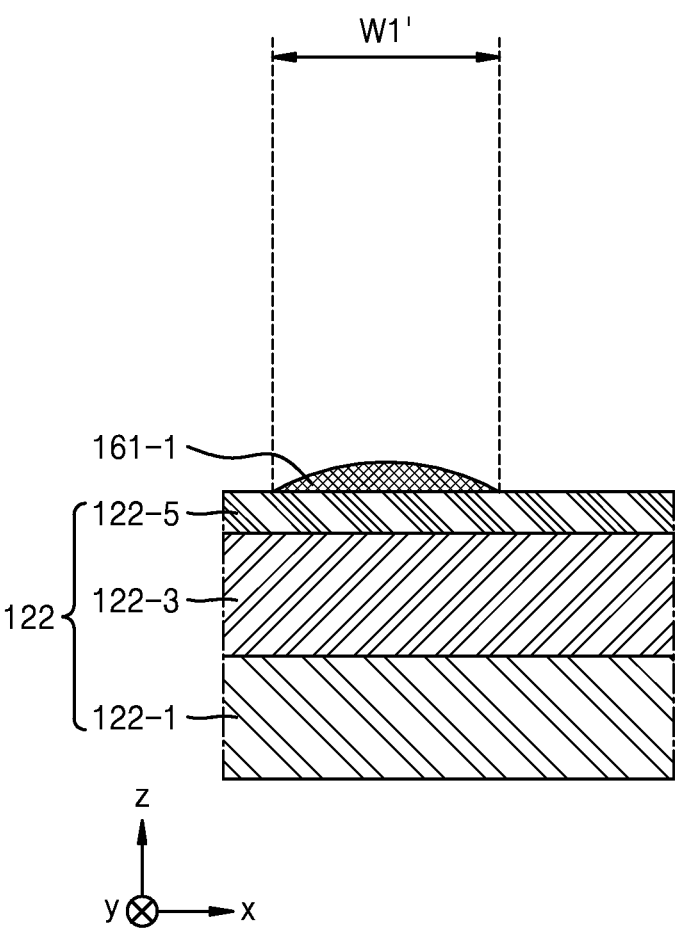
FIGS. 10A, 10B and 10C are cross-sectional views illustrating in more detail a process of forming a dam shown in FIG. 8D, according to an example embodiment.
Figure 10B:
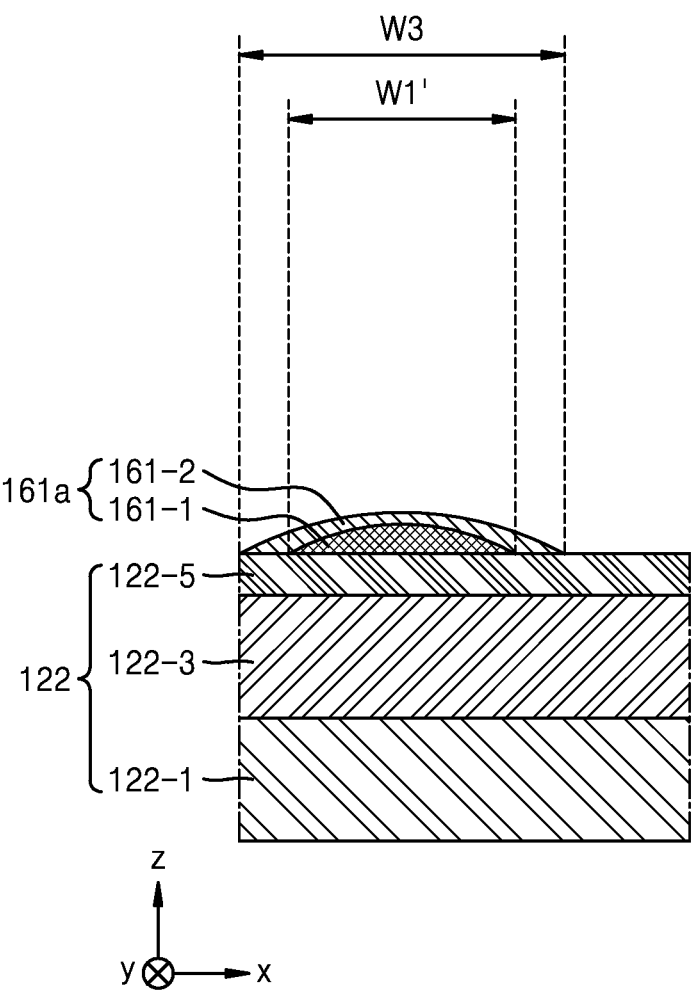
Figure 10C:
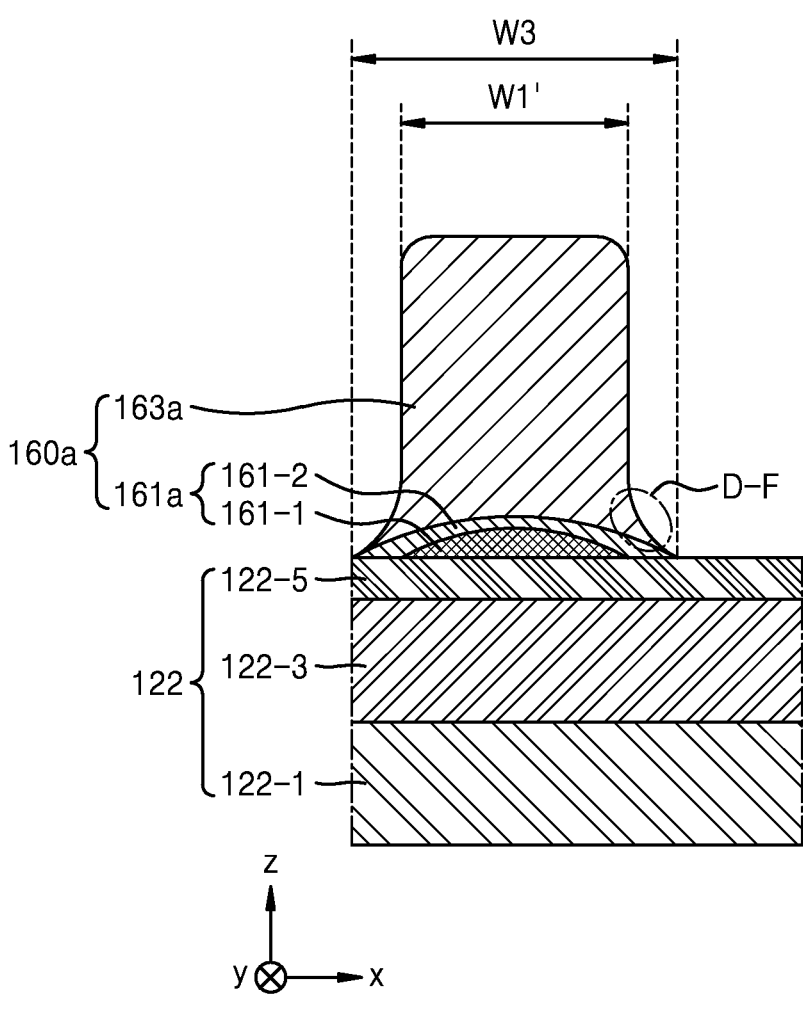

FIGS. 10A to 10C are cross-sectional views illustrating in more detail a process of forming a dam shown in FIG. 8D, according to an example embodiment. Description will be given with reference to FIG. 3B, and descriptions previously given with reference to FIGS. 3A, 3B, and 9A to 9C are briefly given or omitted.

Referring to FIG. 10A, in a method of fabricating the image sensor package 100a, the process of forming the dam 160a of FIG. 8D includes forming the first SRL 161-1 on the chip body 122 of the image sensor chip 120. The first SRL 161-1 may extend in the first direction (x direction) or the second direction (y direction) corresponding to the shape of the dam 160a. Hereinafter, the dam 160a is described as having a portion extending in the second direction (y direction).

The width of the first SRL 161-1 may have the first width W1' in the first direction (x direction). The first width W1' may be, for example, 250 μm or less. However, the first width W1' of the first SRL 161-1 is not limited thereto.

The first SRL 161-1 may be formed by a dispensing method using a dispenser. The first SRL 161-1 may have a lower viscosity than that of the body layer 163a. However, the first SRL 161-1 may have a greater viscosity that that of the second SRL 161-2 to be subsequently formed. For example, the first SRL 161-1 may include a silicone-based material. However, the material of the first SRL 161-1 is not limited to a silicone-based material. For example, the first SRL 161-1 may include an epoxy resin, and a component or component ratio of a filler included in the epoxy resin may be adjusted to lower the viscosity of the first SRL 161-1.

Referring to FIG. 10B, after the first SRL 161-1 is formed, the second SRL 161-2 is formed on the first SRL 161-1. The second SRL 161-2 may have a greater width than that of the first SRL 161-1 in the first direction (x direction). For example, the second SRL 161-2 may have the third width W3 in the first direction (x direction), and the third width W3 may be 350 μm or less. However, the third width W3 of the second SRL 161-2 is not limited thereto. As shown in FIG. 10B, the second SRL 161-2 may completely cover the first SRL 161-1. Also, a portion of the second SRL 161-2 in the first direction (x direction) may cover the upper surface of the chip body 122.

The second SRL 161-2 may be formed by a dispensing method using a dispenser. The second SRL 161-2 may have a lower viscosity than that of the body layer 163a. Also, the second SRL 161-2 may have a lower viscosity than that of the first SRL 161-1. For example, the second SRL 161-2 may include a silicone-based material, and may have a lower viscosity than that of the first SRL 161-1 by adjusting a component or component ratio of a filler included in the silicone-based material. The material of the second SRL 161-2 is not limited to a silicone-based material. For example, the second SRL 161-2 may include an epoxy resin, and may have a required viscosity by adjusting a component or component ratio of a filler included in the epoxy resin. The SRL 161a may be completed through the formation of the second SRL 161-2.

Referring to FIG. 10C, after the SRL 161a is formed, the body layer 163a is formed on the SRL 161a. The body layer 163a may occupy most of the portions of the dam 160a, and may extend in the second direction (y direction) corresponding to the shape of the dam 160a. A width of the body layer 163a in the first direction (x direction) may have the first width W1'. The first width W1' may be, for example, 250 μm or less, and may be substantially the same as the width of the first SRL 161-1. However, the first width W1' of the body layer 163a is not limited thereto. Also, the width of the body layer 163a in the first direction (x direction) may also be different from the width of the first SRL 161-1.

The body layer 163a may be formed by a dispensing method using a dispenser. The body layer 163a may include, for example, an epoxy resin. However, the material of the body layer 163a is not to an epoxy resin. The body layer 163a may be cured through a three-operation curing process. The three-operation curing process is the same as previously described with reference to FIG. 1A. When the body layer 163a is formed, the dam-foot D-F may be formed at a lower portion of the body layer 163a. Through the formation of the body layer 163a, the dam 160a of the image sensor package 100a of FIG. 3B may be completed.

Figure 11A:
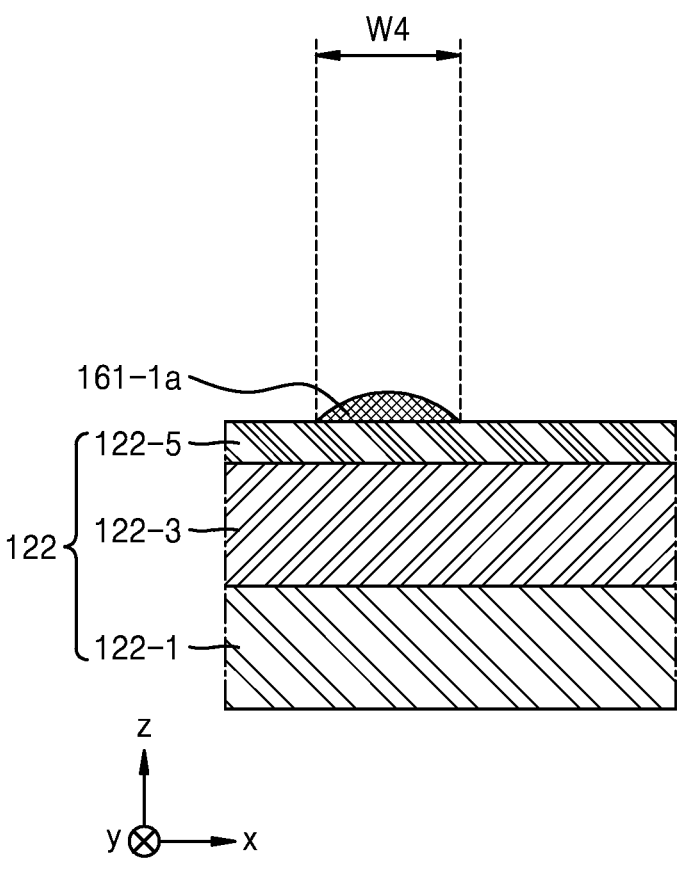
FIGS. 11A, 11B and 11C are cross-sectional views illustrating in more detail a process of forming a dam shown in FIG. 8D, according to an example embodiment.
Figure 11B:
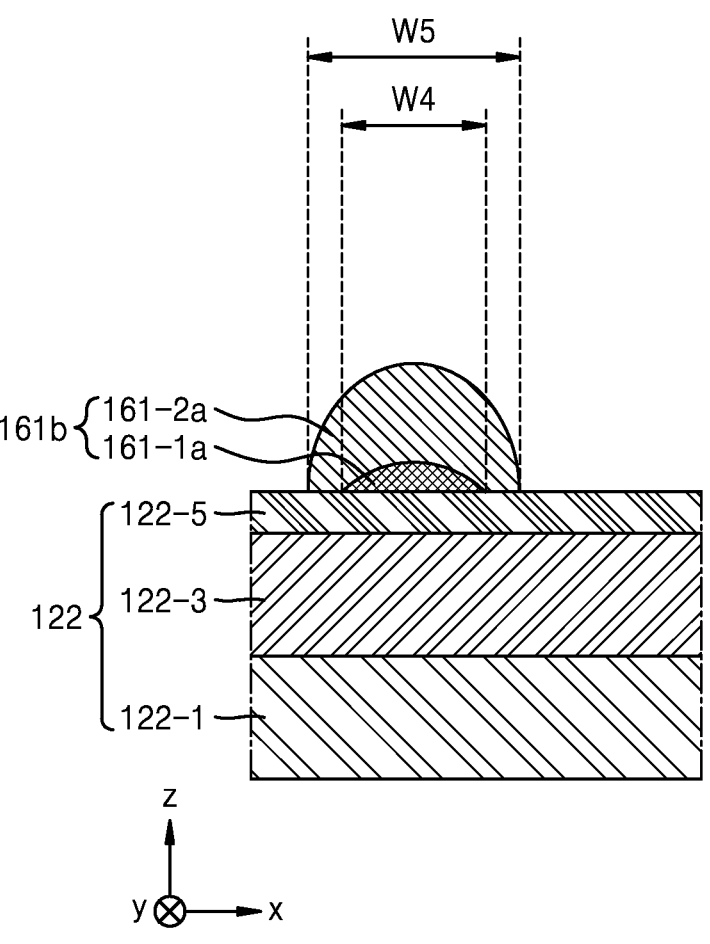
Figure 11C:
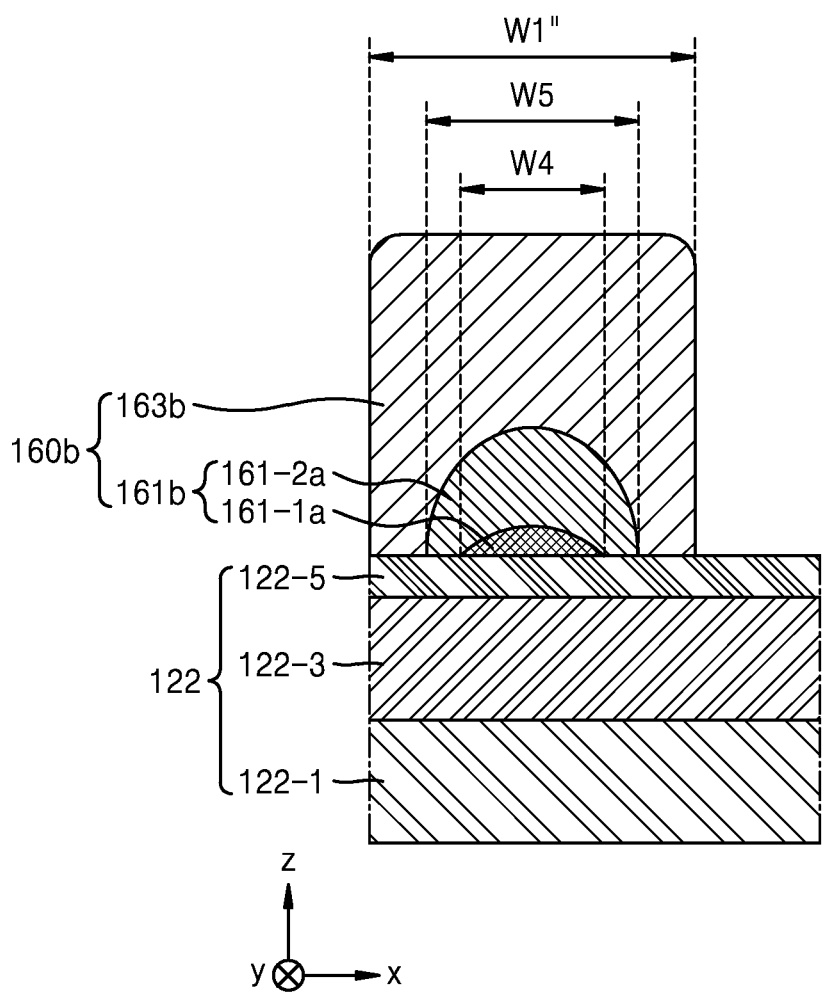

FIGS. 11A to 11C are cross-sectional views illustrating in more detail a process of forming a dam shown in FIG. 8D, according to an example embodiment. Description will be given with reference to FIG. 4B, and descriptions previously given with reference to FIGS. 4A, 4B, and 9A to 10C are briefly given or omitted.

Referring to FIG. 11A, in a method of fabricating the image sensor package 100b, the process of forming the dam 160b of FIG. 8D includes forming the first SRL 161-1a on the chip body 122 of the image sensor chip 120. The first SRL 161-1a may extend in the first direction (x direction) or the second direction (y direction) corresponding to the shape of the dam 160b. Hereinafter, the dam 160b is described as having a portion extending in the second direction (y direction).

The width of the first SRL 161-1a may have the fourth width W4 in the first direction (x direction). The fourth width W4 may be, for example, 150 μm or less. However, the fourth width W4 of the first SRL 161-1a is not limited thereto.

The first SRL 161-1a may be formed by a dispensing method using a dispenser. The first SRL 161-1a may have a lower viscosity than that of the body layer 163b. However, the first SRL 161-1a may have a greater viscosity than that of the second SRL 161-2a to be subsequently formed. For example, the first SRL 161-1a may include a silicone-based material. However, the material of the first SRL 161-1a is not limited to a silicone-based material. For example, the first SRL 161-1a may include an epoxy resin, and a component or component ratio of a filler included in the epoxy resin may be adjusted to lowered the viscosity of the first SRL 161-1a.

Referring to FIG. 11B, after the first SRL 161-1a is formed, the second SRL 161-2a is formed on the first SRL 161-1a. The second SRL 161-2a may have a greater width than that of the first SRL 161-1a in the first direction (x direction). For example, the second SRL 161-2a may have the fifth width W5 in the first direction (x direction), and the fifth width W5 may be 200 μm or less. However, the fifth width W5 is not limited thereto. As shown in FIG. 11B, the second SRL 161-2a may completely cover the first SRL 161-1*a*. Also, a portion of the second SRL **161-2*a* in the first direction (x direction) may cover the upper surface of the chip body 122**.

The second SRL **161-2*a* may be formed by a dispensing method using a dispenser. The second SRL 161-2*a* may have a lower viscosity than that of the body layer 163*b*. Also, the second SRL 161-2*a* may have a lower viscosity than that of the first SRL 161-1*a*. For example, the second SRL 161-2*a* may include a silicone-based material, and may have a lower viscosity than that of the first SRL 161-1*a* by adjusting a component or component ratio of a filler included in the silicone-based material. The material of the second SRL 161-2*a* is not limited to a silicone-based material. For example, the second SRL 161-2*a* may also include an epoxy resin, and may have a required viscosity by adjusting a component or component ratio of a filler included in the epoxy resin. Through the formation of the second SRL 161-2*a*, the SRL 161*b*** may be completed.

Referring to FIG. 11C, after the SRL **161*b* is formed, the body layer 163*b* is formed on the SRL 161*b*. The body layer 163*b* may occupy most of the portions of the dam 160*b*, and may extend in the second direction (y direction) corresponding to the shape of the dam 160*b*. A width of the body layer 163*b* in the first direction (x direction) may have the first width W1". The first width W1" may be, for example, 350 plm or less. However, the first width W1" of the body layer 163*b* is not limited thereto. As shown in FIG. 11C, the body layer 163*b* may completely cover the SRL 16*b*. Also, a portion of the body layer 163*b* in the first direction (x direction) may cover the upper surface of the chip body 122**.

The body layer **163*b* may be formed by a dispensing method using a dispenser. The body layer 163*b* may include, for example, an epoxy resin. However, the material of the body layer 163*b* is not limited to an epoxy resin. The body layer 163*b* may be cured through a three-operation curing process. The three-operation curing process is the same as previously described with reference to FIG. 1A. Through the formation of the body layer 163*b*, the dam 160*b* of the image sensor package 100*b* of FIG. 4B** may be completed.

While aspects of example embodiments have been particularly shown and described, it will be understood that various changes in form and details may be made therein without departing from the spirit and scope of the following claims.

What is claimed is:

1. An image sensor package comprising:
a package substrate;
an image sensor chip provided on the package substrate, and comprising a pixel area and a peripheral area surrounding the pixel area;
a dam in the peripheral area, the dam surrounding the pixel area; and
a transparent cover provided on the dam and covering an upper portion of the image sensor chip,
wherein the dam comprises a stress relaxation layer (SRL) and a body layer on the SRL, and the SRL has a lower viscosity than a viscosity of the body layer, and
wherein along a first direction perpendicular to an extension direction of the dam, the transparent cover extends past an outer side surface of the dam.

2. The image sensor package of claim 1, further comprising a chip pad on the upper portion of the image sensor chip, wherein the dam covers the chip pad.

3. An image sensor package comprising:
a package substrate;

an image sensor chip provided on the package substrate, and comprising a pixel area and a peripheral area surrounding the pixel area;
a dam in the peripheral area, the dam surrounding the pixel area; and
a transparent cover provided on the dam and covering an upper portion of the image sensor chip,
wherein the dam comprises a stress relaxation layer (SRL) and a body layer on the SRL, and the SRL has a lower viscosity than a viscosity of the body layer, and
wherein the SRL is between two dam-walls of the dam along a first direction perpendicular to an extension direction of the dam.

4. The image sensor package of claim 3, wherein the body layer has a width less than an interval between the two dam-walls in the first direction, and
wherein the dam further comprises a dam-foot at a lower portion of the body layer.

5. The image sensor package of claim 1, wherein the SRL comprises a first SRL and a second SRL, and
wherein the first SRL has a greater viscosity than a viscosity of the second SRL.

6. The image sensor package of claim 5, wherein a width of the second SRL is greater than a width of the body layer in a in the first direction.

7. The image sensor package of claim 6, wherein a width of the first SRL is substantially equal to the width of the body layer in the first direction,
wherein a width of the second SRL is greater than the width of the body layer in the first direction,
wherein the second SRL completely covers the first SRL, and
wherein the body layer is on the second SRL.

8. The image sensor package of claim 5, wherein a width of the second SRL is less than the width of the body layer in the first direction.

9. The image sensor package of claim 8, wherein a width of the second SRL is greater than the width of the first SRL in the first direction,
wherein the second SRL completely covers the first SRL, and
wherein the body layer completely covers the second SRL.

10. The image sensor package of claim 1, wherein the image sensor chip comprises a SiO2 film formed on an upper surface thereof,
wherein the dam is formed on the SiO2 film, and
wherein the SRL comprises a material that reduces a difference in coefficient of thermal expansion (CTE) between the body layer of the dam and the SiO2 film.

11. The image sensor package of claim 1, wherein the body layer comprises an epoxy resin, and
wherein the SRL comprises a silicone-based material.

12. The image sensor package of claim 1, further comprising a sealing material provided on a side surface of the dam.

13. An image sensor package comprising:
a package substrate comprising a substrate pad and an external connection terminal;
an image sensor chip provided on the package substrate and comprising a pixel area and a peripheral area surrounding the pixel area;
a dam surrounding the pixel area and covering a chip pad of the image sensor chip;
a transparent cover on the dam and spaced apart from an upper surface of the image sensor chip; and a bonding wire electrically connecting the chip pad and the substrate pad, wherein the dam comprises a stress relaxation layer (SRL) and a body layer on the SRL, and the SRL has a lower viscosity than a viscosity of the body layer, and wherein along a first direction perpendicular to an extension direction of the dam, the transparent cover extends past an outer side surface of the dam.

14. The image sensor package of claim 13, wherein the external connection terminal has a ball grid array (BGA) structure, and wherein the dam covers an end of the bonding wire connected to the chip pad.

15. The image sensor package of claim 13, wherein the SRL is between two dam-walls of the dam along the first direction.

16. The image sensor package of claim 13, wherein the SRL comprises a first SRL and a second SRL, and wherein the first SRL has a greater viscosity than a viscosity of the second SRL.

17. The image sensor package of claim 16, wherein a width of the first SRL is substantially equal to a width of the body layer in the first direction, wherein the second SRL has a greater width than the width of the body layer in the first direction, and completely covers the first SRL, and wherein the body layer is on the second SRL.

18. The image sensor package of claim 16, wherein a width of the body layer is greater than a width of the SRL in the first direction, wherein a width of the second SRL is greater than the width of the first SRL in the first direction, and completely covers the first SRL, and wherein the body layer completely covers the second SRL.

19. The image sensor package of claim 13, further comprising a sealing material provided on a side surface of the dam.

\* \* \* \* \*